(12) United States Patent
Nagayama et al.

(10) Patent No.: US 9,346,242 B2
(45) Date of Patent: *May 24, 2016

(54) MULTI-LAYER THIN FILM ASSEMBLY AND BARRIER FILM FOR ELECTRONIC DEVICE INCLUDING THE SAME

(71) Applicant: SAMSUNG ELECTRONICS CO., LTD., Suwon-si, Gyeonggi-do (KR)

(72) Inventors: Kenichi Nagayama, Yokohama (JP); Yukika Yamada, Yokohama (JP); Hisanao Usami, Ueda (JP)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/712,209

(22) Filed: Dec. 12, 2012

(65) Prior Publication Data

US 2013/0149517 A1    Jun. 13, 2013

(30) Foreign Application Priority Data

Dec. 13, 2011  (JP) .................................. 2011-272327
Sep. 5, 2012   (KR) ....................... 10-2012-0098275

(51) Int. Cl.

| B32B 9/00 | (2006.01) |
| B32B 27/08 | (2006.01) |
| B05D 7/00 | (2006.01) |
| H01L 23/31 | (2006.01) |
| C09D 183/08 | (2006.01) |
| B82Y 30/00 | (2011.01) |
| C08G 77/26 | (2006.01) |

(52) U.S. Cl.
CPC ... *B32B 9/00* (2013.01); *B05D 7/54* (2013.01); *B32B 27/08* (2013.01); *C09D 183/08* (2013.01); *H01L 23/3192* (2013.01); *B82Y 30/00* (2013.01); *C08G 77/26* (2013.01); *H01L 2924/0002* (2013.01); *Y10T 428/31504* (2015.04); *Y10T 428/31663* (2015.04)

(58) Field of Classification Search
None
See application file for complete search history.

(56) References Cited

U.S. PATENT DOCUMENTS 3,627,565 A * 12/1971 Plueddemann ........ C08K 5/544
                                                       427/386
3,910,797 A * 10/1975 Beers ...................... C04B 28/24
                                                       106/1.12

(Continued)

FOREIGN PATENT DOCUMENTS

JP    2003041153 A    2/2003
JP    2006282977 A    10/2006

(Continued)

OTHER PUBLICATIONS

He et al., Grafting of Swelling Clay Materials with 3-aminopropyltriethoxysilane, Apr. 12, 2005, J. Colloid and Interface Science, 288, 171-176.*

(Continued)

*Primary Examiner* — Aaron Austin
*Assistant Examiner* — Zheren J Yang
(74) *Attorney, Agent, or Firm* — Cantor Colburn LLP

(57) ABSTRACT

A multi-layer thin film assembly including a first layer including a first material, wherein the first material includes at least two kinds of functional groups, and a second layer disposed on the first layer and including a second material that interacts with the at least two kinds of functional groups, and a barrier film including the same.

14 Claims, 18 Drawing Sheets

(56) References Cited

U.S. PATENT DOCUMENTS

| | | | | |
|---|---|---|---|---|
| 4,786,558 A * | 11/1988 | Sumiya | C08J 7/047 | 428/215 |
| 4,942,094 A * | 7/1990 | Okamura | B32B 19/04 | 428/324 |
| 5,200,378 A * | 4/1993 | Clearfield | B01J 29/049 | 502/62 |
| 5,770,266 A * | 6/1998 | Ogawa | B05D 1/185 | 427/333 |
| 5,906,892 A * | 5/1999 | Thompson | B01J 23/42 | 427/380 |
| 6,117,932 A * | 9/2000 | Hasegawa | B82Y 30/00 | 524/445 |
| 6,121,360 A * | 9/2000 | Hoyes | F16J 15/102 | 428/447 |
| 6,475,581 B2 * | 11/2002 | Lustig | B65D 65/42 | 427/299 |
| 6,903,035 B2 * | 6/2005 | Aono et al. | 501/12 | |
| 7,138,452 B2 * | 11/2006 | Kim | C08K 9/04 | 523/205 |
| 7,189,433 B2 * | 3/2007 | Kagan | B05D 1/185 | 427/333 |
| 7,638,199 B2 * | 12/2009 | Hirano | C03C 17/34 | 427/407.1 |
| 7,764,416 B2 * | 7/2010 | Wu | B82Y 20/00 | 359/265 |
| 7,824,767 B2 | 11/2010 | Murase et al. | | |
| 8,048,487 B2 * | 11/2011 | Hanson | B05D 1/185 | 427/383.1 |
| 8,771,926 B2 * | 7/2014 | Baldwin | C08F 126/10 | 101/453 |
| 2003/0113569 A1 * | 6/2003 | Cott et al. | 428/515 | |
| 2003/0116061 A1 * | 6/2003 | Aono | C03C 14/004 | 106/286.8 |
| 2003/0220188 A1 * | 11/2003 | Marand et al. | 502/60 | |
| 2004/0022706 A1 * | 2/2004 | Tani | B05D 5/00 | 423/1 |
| 2004/0053037 A1 * | 3/2004 | Koch | B05D 7/56 | 428/323 |
| 2004/0138339 A1 * | 7/2004 | Freeman | C08K 9/06 | 523/200 |
| 2004/0253463 A1 * | 12/2004 | Inui | B32B 27/06 | 428/448 |
| 2005/0079380 A1 * | 4/2005 | Iwanaga | B32B 27/06 | 428/688 |
| 2005/0142349 A1 * | 6/2005 | Irwin | B32B 15/20 | 428/323 |
| 2006/0088707 A1 * | 4/2006 | Oosaki | B32B 5/12 | 428/212 |
| 2006/0155030 A1 * | 7/2006 | Aupaix | C01B 25/372 | 524/413 |
| 2007/0099004 A1 * | 5/2007 | Edelmann | C08G 77/22 | 428/447 |
| 2007/0128490 A1 * | 6/2007 | Li | B01D 67/0009 | 521/25 |
| 2007/0299188 A1 * | 12/2007 | Chan | B82Y 30/00 | 524/445 |
| 2008/0131635 A1 * | 6/2008 | Ono | C12N 5/0068 | 428/35.7 |
| 2008/0213558 A1 | 9/2008 | Murase et al. | | |
| 2009/0061204 A1 * | 3/2009 | Hsu | C08G 18/3895 | 428/305.5 |
| 2009/0141230 A1 * | 6/2009 | Inoue | C04B 35/597 | 349/158 |
| 2009/0148688 A1 * | 6/2009 | Sasaki | C09D 183/04 | 428/315.9 |
| 2010/0136350 A1 * | 6/2010 | Inaba et al. | 428/447 | |
| 2010/0221443 A1 * | 9/2010 | Kimura | C03C 17/30 | 427/419.8 |
| 2010/0304154 A1 * | 12/2010 | Batenburg et al. | 428/446 | |
| 2010/0330380 A1 * | 12/2010 | Colreavy | C09C 1/64 | 428/447 |
| 2011/0076474 A1 * | 3/2011 | Mapkar | B82Y 30/00 | 428/213 |
| 2011/0076504 A1 * | 3/2011 | Van De Weerdt | C08F 220/34 | 428/463 |
| 2011/0186685 A1 * | 8/2011 | Tsotsis | B64C 21/10 | 244/130 |
| 2011/0195260 A1 * | 8/2011 | Lee | B81C 3/001 | 428/447 |
| 2012/0202047 A1 * | 8/2012 | Welch | B32B 5/16 | 428/323 |
| 2012/0308761 A1 * | 12/2012 | Tsuda | B32B 27/08 | 428/76 |
| 2013/0023620 A1 * | 1/2013 | Abusleme | C08F 8/00 | 524/546 |
| 2013/0065026 A1 * | 3/2013 | Walther | D21H 27/32 | 428/195.1 |
| 2013/0071672 A1 * | 3/2013 | Li | B32B 27/08 | 428/447 |
| 2013/0149513 A1 * | 6/2013 | Nagayama | B32B 9/048 | 428/212 |
| 2013/0158180 A1 * | 6/2013 | Tsou | C08K 9/06 | 524/413 |
| 2014/0242393 A1 * | 8/2014 | Olmeijer | C08F 18/14 | 428/413 |
| 2015/0045207 A1 * | 2/2015 | Sukhishvili | C08K 3/34 | 502/62 |

FOREIGN PATENT DOCUMENTS

| | | | |
|---|---|---|---|
| JP | 2007022075 A | | 2/2007 |
| JP | 2009095762 A | * | 5/2009 |
| JP | 2009095763 A | * | 5/2009 |
| JP | 2009095764 A | * | 5/2009 |
| JP | 2009196318 A | | 9/2009 |
| JP | 2010142732 A | | 7/2010 |
| WO | 2007114192 A1 | | 10/2007 |
| WO | WO 2011123056 A1 | * | 10/2011 |
| WO | WO 2012112624 A2 | * | 8/2012 |

OTHER PUBLICATIONS

NPL_Silane.*
He et al, Grafting of Swelling Clay Materials with 3-aminopropyltriethoxysilane, J. Colloid and Interface Sciences 2005 pp. 171-176.*
Zhou et al., "Preparation and Functionality of Clay-containing Film", J. Mater. Chem., 2011, 21, 15132. NPL_Zhou.*
Jonas et al., "Size and Shape of Montmorillonite Crystallites", from Fifteenth Conference on Clay and Clay Minerals, 1967.*
Zhou et al. "Preparation and Functionality of Clay-containing Film", J.Mater. Chem., 2011, 21, 15132.*
Jonas et al., "Size and Shape of Montmorillonite Crystallites", Fifteenth Conference on Clay and Clay Minerals, 1967.*
Zhou et al. "Preparation and Functionality of Clay-containing Film", J. Mater. Chem., 2011, 21, 15132.*
Jonas et al. "Size and Shape of Montmorillonite Crystallites," Fifteenth Conference on Clay and Clay Minerals, 1967.*
Machine translation of JP 2009/095762, obtained from Industrial Property Digital Library of the JPO on Dec. 21, 2015.*
Machine translation of JP 2009/095763, obtained from Industrial Property Digital Library of the JPO on Dec. 21, 2015.*
Machine translation of JP 2009/095764, obtained from Industrial Property Digital Library of the JPO on Dec. 21, 2015.*
Lawrence E. Nielsen, "Models for the Permeability of Filled Polymer Systems," Journal of Macromolecular Science: Part A—Chemistry, 1:5, (1967) pp. 929-942.
G. Decher, et al., "Buildup of ultrathin multilayer films by a self-assembly process: III. Consecutively alternating adsorption of anionic and cationic polyelectrolytes on charged surfaces," Thin Solid Films, 210/211 (1992) pp. 831-835.

* cited by examiner

MULTI-LAYER THIN FILM ASSEMBLY AND BARRIER FILM FOR ELECTRONIC DEVICE INCLUDING THE SAME

CROSS-REFERENCE TO RELATED APPLICATION

This application claims priority to and the benefits of Japanese Patent Application No. 10-2011-272327 filed on Dec. 13, 2011, and Korean Patent Application No. 10-2012-0098275, filed on Sep. 5, 2012, and all the benefits accruing therefrom under 35 U.S.C. §119, the contents of which are incorporated herein in their entirety by reference.

BACKGROUND

1. Field

A multi-layer thin film assembly and a barrier film for an electronic device are disclosed.

2. Description of the Related Art

A barrier film including a barrier layer which prevents external oxygen and/or moisture from flowing in onto a resin film has been used as a flexible substrate for an electronic device.

The barrier film may include a plurality of layers to improve barrier performance. However, making the barrier film including a plurality of the layers may require a complex process. In addition, the plurality of layers may have low close contacting property, i.e., may not be in sufficiently intimate contact, which may lead to poor barrier performance of the film. Thus, there is a current need for a barrier film which would possess excellent contact between the layers, and which would be easy to manufacture.

SUMMARY

An embodiment provides a multi-layer thin film assembly having improved barrier performance due to an excellent close contacting property between layers.

Another embodiment provides a barrier film for an electronic device including the multi-layer thin film assembly.

According to an embodiment, provided is a multi-layer thin film assembly that includes a first layer including a first material, wherein the first material includes at least two kinds of functional groups, and a second layer disposed on the first layer and including a second material, wherein the second material interacts with the at least two kinds of functional groups.

The first layer and the second layer may be alternately stacked.

The second material may interact with the at least two kinds of functional groups of the first material through at least one of an electrostatic force and a chemical bonding force.

The second material may interact with the at least two kinds of the functional groups of the first material through the electrostatic force and the chemical bonding force.

At least one of the at least two kinds of functional groups of the first material may be a functional group that is electrostatically chargeable with a positive charge or a negative charge.

The second material may include a material that is electrostatically chargeable with a charge opposite to that of the at least one electrostatically chargeable functional group of the first material.

The first material may comprise a plurality of at least one kind of the functional groups, which may interact with each other.

The first material may include a metal alkoxide compound represented by the following General Formula 1.

  General Formula 1

In General Formula 1,
M is a metal atom, R is an alkyl group, X is a functional group, and n and m are independently integers, wherein n+m=2 to 6.

The first material may be an alkoxysilane compound represented by the following General Formula 2.

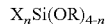  General Formula 2

In General Formula 2,
R is an alkyl group, X is a functional group, and n is an integer of 0 to 4.

The functional group X may include at least one selected from a nitrogen-containing group, an oxo-acid group, an ester of an oxo-acid group, an anhydride of an oxo-acid group, a nitrogen-containing group, an oxo-acid group, an ester of an oxo-acid group, an anhydride of an oxo-acid group, a hydroxyl group, an epoxide group, an ester group, an isocyanate group, an acid halide group, a urea group, a thiol group, an aldehyde group, an imide group, an amide group, an unsaturated group, an acetal group, an imine group, and a thiocyanate group. In an embodiment, the functional group X is an aminoalkyl group, an alkyl carbonic acid group, an alkyl succinic acid group, and an alkyl succinic anhydride group.

The second material may include an inorganic layered compound.

The inorganic layered compound may include at least one selected from a clay mineral, a phosphate salt-based derivative compound, and layered plural hydrates.

The at least two kinds of functional groups may be present on at least one of a flat plane and an edge part of the inorganic layered compound.

According to another embodiment, a barrier film for an electronic device including the multi-layer thin film assembly is provided.

The multi-layer thin film assembly may have a film thickness of less than or equal to about 50 nanometers ("nm").

The barrier film for an electronic device may have a water vapor transmission rate of less than or equal to about 0.5 gram per square meter per day ("g/m²/day").

In the barrier film a plurality of the first layer and the second layer may be alternately stacked.

The second material in the barrier film may interact with the at least two kinds of the functional groups of the first material through at least one of an electrostatic force and a chemical bonding force.

At least one of the at least two kinds of functional groups of the first material in the barrier film may be a functional group comprising a positive charge or a negative charge, and the second material may comprise a charge opposite to the positive or negative charge of the functional groups of the first material.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1A:
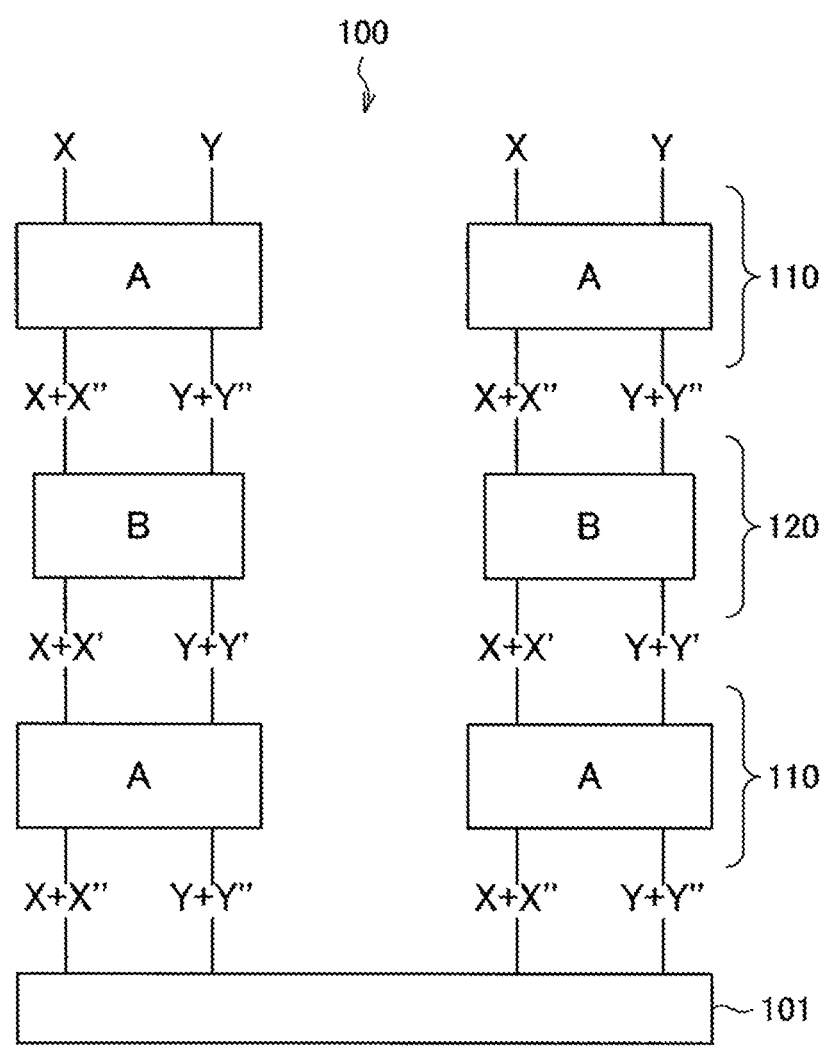
FIGS. 1A and 1B are cross-sectional views of multi-layered thin film assemblies according to embodiments.

Exemplary embodiments will be described more fully hereinafter with reference to the accompanying drawings, in which various embodiments are shown. This disclosure may, however, be embodied in many different forms and should not be construed as limited to the exemplary embodiments set forth herein. Accordingly, the embodiments are merely described below, by referring to the figures, to explain aspects of the present description. These embodiments are provided so that this disclosure will be thorough and complete, and will fully convey the scope of the claims to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "alkyl" means a completely saturated, branched, or unbranched hydrocarbon having, for example, 1 to 32, 1 to 22, or 1 to 6 carbon atoms. Non-limiting examples of the "alkyl" group are methyl, ethyl, n-propyl, iso-propyl, n-butyl, iso-butyl, sec-butyl, t-butyl, iso-pentyl, neo-pentyl, iso-amyl, n-hexyl, 3-methylhexyl, 2,2-dimethylpentyl, 2,3-dimethylpentyl, and n-heptyl.

As used herein, the term "alkoxy" means alkyl-O—, wherein alkyl is defined above. Examples of alkoxy include, but are not limited to, methoxy, ethoxy, propoxy, 2-propoxy, butoxy, tert-butoxy, pentyloxy, hexyloxy, cyclopropyloxy, cyclohexyloxy, and the like.

As used herein, the term "aromatic" means a group derived from a cyclic hydrocarbon having alternating double bonds and single bonds between ring atoms with 1 to 3 heteroatoms (P, S, Si, O, N, or P) in the ring. An "aryl" group is a monovalent aromatic group, specifically a monovalent aromatic group having only carbon atoms in the ring.

Hereinafter, the barrier film for an electronic device according to an embodiment is described with reference to the drawings.

Figure 1B:
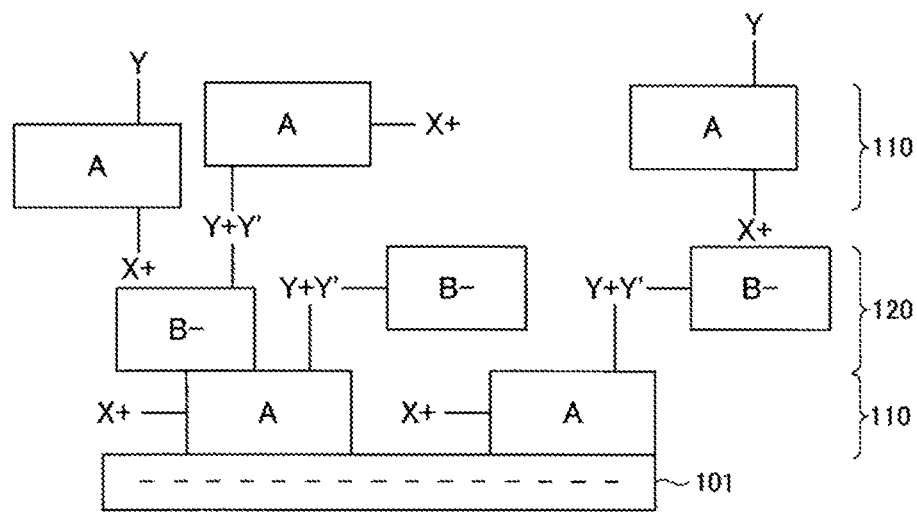

FIGS. 1A and 1B are cross-sectional views of multi-layered thin film assemblies according to an embodiment.

Referring to FIGS. 1A and 1B, a multi-layer thin film assembly 100 may include a first layer 110 and a second layer 120 wherein the first layer 110 and the second layer 120 are stacked alternately on a substrate 101. Although FIG. 1A shows a stacked assembly including the first layer 110, second layer 120, and first layer 110, it should be understood that the assembly may include a plurality of the first layers and second layers, i.e., at least one first layer 110 and at least one second layer 120, and that the number of the first layers 110 and the second layers 120 may be unlimited. In an embodiment, the first layer 110 and second layer 120 may be alternately stacked.

The first layer 110 may include a first material including at least two kinds of functional groups, and the second layer 120 may include a second material that interacts with the at least two kinds of functional groups of the first material.

As an example and as shown in FIG. 1A, the first material may be a material A having a functional group X and a functional group Y, and the second material may be a material B having a functional group X' and a functional group Y'. Herein, the functional group X' may interact with the functional group X and the functional group Y' may interact with the functional group Y. Thereby, the functional group X is bonded with the functional group X' and the functional group Y is bonded with the functional group Y', and thus the first layer 110 may closely contact the second layer 120. As further described below the interactions may be by one or more bonding forces.

In an embodiment, as shown in FIG. 1B, the first material may be a material A including a negatively (not shown) or positively electrostatically chargeable functional group X+ and a non-charged functional group Y, and the second material may be a material B including a non-charged functional group Y'. Herein, the functional group Y' may interact with the functional group Y, for example by forming a chemical bond (a chemical bonding force). Further as shown in FIG. 1B, and the material B is negatively electrostatically charged (B−). Thereby, the negatively electrostatically chargeable material B may interact with the positively charged functional group X+ of the material A by an electrostatic force. Thus, the first layer 110 may closely contact the second layer 120 through a chemical bonding force and an electrostatic force.

As shown in FIGS. 1A and 1B, the first layer 110 and the second layer 120 include the material A and the material B, respectively. However, it should be understood that the first layer 110 may further include another material that interacts with a material of the second layer 120 without limitation, and the second layer 120 may include another material that interacts with a material of the first layer 110 without limitation. For example, the first layer may further include a material C having at least one functional group which is either the same as or different from the functional group X and the functional group Y. In an embodiment, the materials may be stacked as follows: material A/material C/material B/material B/material A/material B, wherein the material A and the material C may be included in the first layer 110 and the material B may be included in the second layer 120.

As further shown in FIGS. 1A and 1B, the material A may be directly formed or deposited on the substrate 101, and the material B may be directly formed or deposited on the material A. In another embodiment, the material B may be directly formed or deposited on the substrate 101 and the material A may be directly formed or deposited on the material B. A plurality of the first material and second material may therefore include two or more of material B and one or more of material A. In yet another embodiment, the substrate 101 may be surface treated to strengthen a bonding of the material A or the material B to the surface of the substrate 101.

Hereinafter, the substrate 101, the first layer 110, and the second layer 120 are described in detail.

The substrate 101 may be a substrate for forming the lowest first layer 110 (e.g., material A or material B). The substrate 101 may include a material having a surface that renders the first material (e.g., material A or material B) adsorbable, or, in an embodiment, a surface of the substrate 101 may be treated in order increase adsorbtion, that is, to strengthen bonding of the first material to it.

As shown in FIG. 1A, the substrate 101 may be made of a material having at least one of a functional group X'' that interacts (e.g., is chemically or electrostatically bondable) with the functional group X of the material A, and at least one of a functional group Y'' that interacts (e.g., is chemically or electrostatically bondable) with the functional group Y of the material A.

As shown in FIG. 1B, the substrate 101 may be made of a material that is electrostatically charged with an opposite charge to a charge of a functional group of the first material, for example is charged negatively so as to electrostatically bond to the positively charged functional group X+.

The substrate 101 may include an inorganic material such as a ceramic, glass, metal, or a silicon wafer having an oxidized surface, and the like, or may include an organic material that is a polymer film. The inorganic or organic material can be surface-treated with corona discharge, $UV/O_3$, an electron beam ("EB"), and the like. The organic material of the surface-treated polymer film may be an organic material that is treated with a silane coupling agent having a functional group (e.g., an amino group) and an alkoxy group. As a result of the surface treating, the substrate 101 may have the functional group (e.g., an amino group) attached to its surface.

The first layer 110 may be a layer formed on the surface of the substrate 101 and made of the first material, or may be pre-formed and then deposited on the surface of the substrate 101. The first material may be a material including at least two kinds of functional groups.

The functional group of the first material may include, for example, a nitrogen-containing group such as an amino group, an ammonium group, an alkylamino group, a dialkylamino group, an arylamino group, a diarylamino group, a pyridyl group, a pyridinium group, a bipyridyl group, a terpyridyl group, a pyridazine group, a pyrimidine group, a pyrazine group, a triazine group, a quinolone group, a quinolium group, an isoquinoline group, an isoquinolium group, or a substituent having one or more of the foregoing functional groups.

At least one of the functional groups of the first material may be a functional group that is electrostatically chargeable such that it may bear a positive charge or a negative charge. Such a functional group may be, for example, a positively charged nitrogen-containing substituent (i.e., a cationic moiety wherein at least one nitrogen atom is a tetracoordinated nitrogen atom which is connected to four different substituents or enclosed in a ring system). For example, a positively charged nitrogen-containing substituent may be formed by a protonation or alkylation of pyrrole or imidazole. In a specific embodiment the functional group may be a substituent including a cationic moiety wherein at least one nitrogen atom of the above-described nitrogen atom-containing substituent undergoes alkylation or protonation, or a has a condensation ring backbone structure, a substituted compound having a pyrrole, an imidazole, and moieties thereof, or a substituent including a cationic moiety where at least one nitrogen atom of 5-membered ring backbone structure such as a pyrrole or imidazole undergoes alkylation or protonation or has a condensation ring backbone structure.

In the cationic moiety, some or all of the nitrogen atoms may be replaced with phosphorus (P), arsenic (As), or antimony (Sb) to provide a functional group having cationic properties. For example, phosphorus-containing moieties, known to have high thermal and structural stability, may be suitable as replacements of the nitrogen-containing fragments. The functional group of the first material having a cationic moiety may interact with an anionic moiety of the second material (e.g., anionic inorganic layered compound, and the like) by electrostatic force.

Non-limiting examples of the functional groups of the first material that may interact with a cationic second material (e.g., a cationic inorganic layered compound) by an electrostatic force may be an oxo-acid group such as a sulfinic acid group, a sulfonic acid group, a sulfurous acid group, a sulfuric acid group, a selenic acid group, a telluric acid group, a phosphoric acid group, a phosphorus acid group, a phosphonic acid group, a nitrous acid group, a nitric acid group, an arsenic acid group, an arsenious acid group, an antimonic acid group, an antimonous acid group, and the like, or derivatives of the foregoing groups such as an ester of the foregoing groups as well as a carboxylic acid group, an ester thereof, or a carboxylic acid anhydride group, such as succinic anhydride.

The functional group of the first material may be, for example, groups capable of forming a chemical bond with the second material or a functional group of the second material, for instance a hydroxyl group such as a phenol or catechol group, an epoxide group such as an oxetane group, an ester group, an isocyanate group, an acid halide group, a urea group, a thiol group, an aldehyde group, an imide group, an amide group, an unsaturated group such as an ally or vinyl group, an acetal group, an imine group, a thiocyanate group, and the like. For example, when the second material is a layered compound having a hydroxy group between the layers such as kanemite or zirconium phosphate, a functional group of the first material, such as a hydroxyl group, a phenol group, a catechol group, or its precursor, an oxetane group, an ester group, an isocyanate group, an acid halide group, and the like, may be capable of strongly chemically bonding by forming a chemical bond with the hydroxy group of the second material as a result of a condensation reaction.

The substitutents of the first material may be at least two kinds selected from the foregoing groups, but are not limited thereto.

Figure 2:
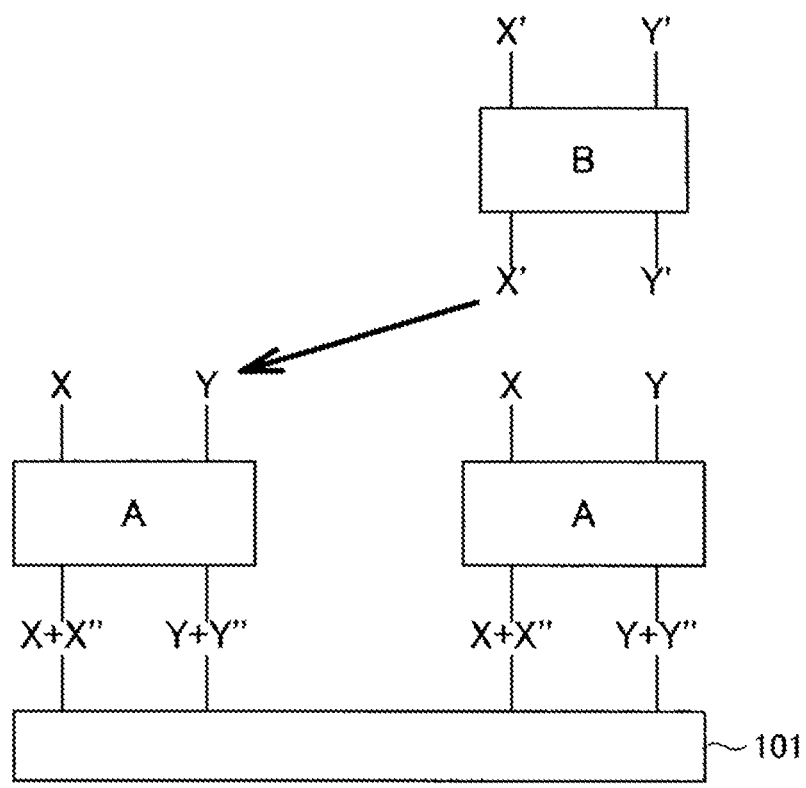
FIG. 2 is a schematic view showing interaction between the first material and the second material in a multi-layer thin film assembly according to an embodiment.

At least one kind of the functional groups (the functional groups that may interact with the second material) of the first material may be present in plural. For example, as shown in FIG. 2, when a substrate has a functional group X" that may interact with the functional group X of the first material, not all the functional group X's of the first material A may interact with the functional group X" of the substrate 101. There still may be a functional group of the first material that interacts with the functional group X' of the second material B.

Specifically, referring to FIG. 2, when the first material A has two functional groups X, one of the functional groups X of the first material A may interact with (bond to) the functional group X" on the surface of the substrate 101, and the other one of the functional groups X may interact with (bond to) the functional group X' of the second material B.

Figure 3:
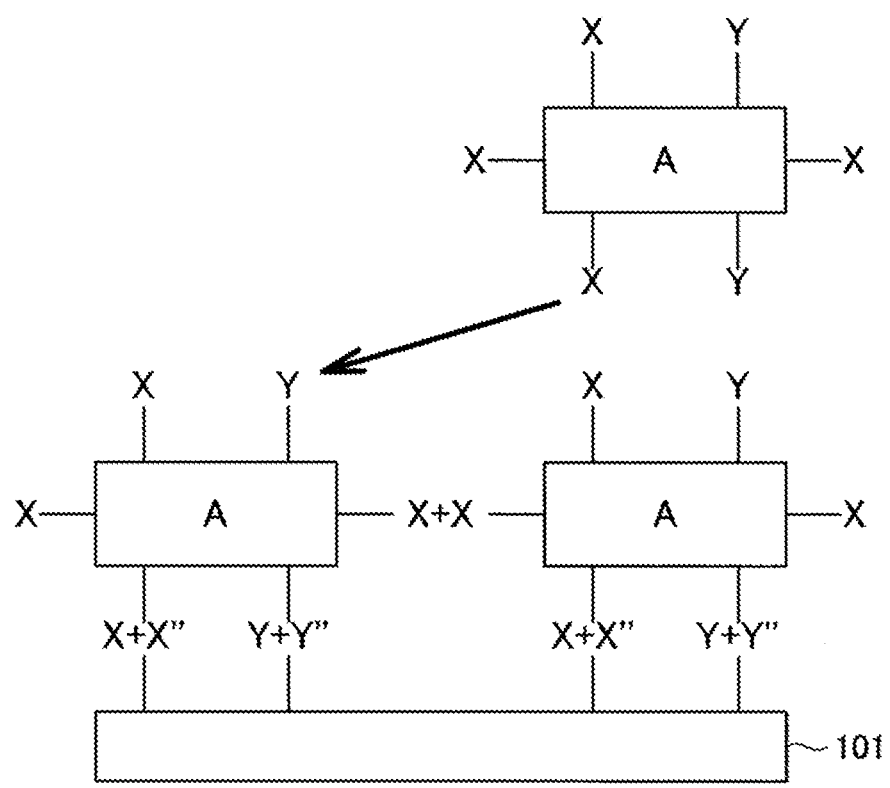
FIG. 3 is a schematic view showing interaction between the first material and the second material in a multi-layer thin film assembly according to another embodiment.

When the first material has a plurality of at least one kind of functional groups that interacts with the second material, the functional groups of the first material may also interact with each other. For example, as shown in FIG. 3, the first material A may include a plurality of the functional groups X that interact not only with the second material but also with each other. When the functional group X of the first material A interacts with a functional group X of an adjacent first material A, the two units of the first material A become bonded to each other to form a network of bonded units resulting in a stronger thin film. As a result, the first layer 110 may form a mechanically structured film without defects.

In an embodiment, the first material A including the at least two kinds of functional groups (e.g., a functional group X and a functional group Y), may be mixed with a material C also including at least two kinds of functional groups (e.g., material C has a functional group X and a functional group Z) wherein the material A and the material C have a functional group X in common. As a result, the material A and material C may be simultaneously present in the first layer 110.

A specific example of the first material may include, for example, a metal alkoxide compound represented by the following General Formula 1.

  General Formula 1

In General Formula 1,
M is a metal,
X is a functional group,
R is an alkyl group, and
n and m are independently integers, wherein n+m=2 to 6.

The M may include, for example Si, Ge, Sn, Pb, B, Al, Ga, In, Ti, Zr, Hf, Y, and the like.

The X may be the groups listed as examples of functional groups of the first material, with the exception of an alkoxy group. For example, the functional group X may include at least one selected from a nitrogen-containing group, an oxo-acid group, or an anhydride of an oxo-acid group, for example an aminoalkyl group (i.e., $H_2NR$—), a carboxylic acid group, an alkyl carbonic acid group (i.e., RO—C(=O)OH), an alkyl succinic acid group, and an alkyl succinic anhydride group. The functional group X may interact with the second material, e.g., material B.

In General Formula 1, an alkoxy group (—OR) may be hydrolyzed to a hydroxy group. The resulting hydroxy group may be capable of interacting with the second material, e.g., material B. In addition, the hydroxy group produced by the hydrolysis of the alkoxy group may be combined chemically via a condensation reaction so as to form a network of the metal alkoxide residues bonded by an O-M-O bond.

For example, when M of the General Formula 1 is Si, the first material may be an alkoxysilane compound represented by the following General Formula 2.

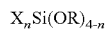  General Formula 2

In General Formula 2,
X is a functional group,
R is an alkyl group, and
n is an integer of 0 to 4.

The X may be the groups listed as examples of functional groups of the first material, with the exception of an alkoxy group. For example, the functional group X may include at least one selected from a nitrogen-containing group, an oxo-acid group, or an anhydride of an oxo-acid group, for example an aminoalkyl group, a carboxylic acid group, an alkyl carbonic acid group, an alkyl succinic acid group (i.e., a succinic acid group substituted on the backbone with an alkyl group), and an alkyl succinic anhydride group.

When the metal alkoxide compound of the General Formula 2 is used, the functional group X may interact with the second material, and an alkoxy group may be hydrolyzed to a hydroxy group (—OH) and the resulting hydroxy group may interact with the second material. When there are two or more hydroxy groups present on the surface of the first material, a hydroxy group that does not interact with the second material may interact with (bond to) another hydroxy group of the first material to form an O—Si—O network that is similar to the backbone of silica. The material having the foregoing O—Si—O network may have good transparency, heat resistance, and gas barrier characteristics, and may be useful for producing an optical thin film, or barrier thin film.

In an embodiment, a mixture of the material represented by the General Formula 1 and a material represented by the following General Formula 3 may be used as the first material.

$$M'(OR)_m \qquad \text{General Formula 3}$$

In General Formula 3,

M' is a metal and may be the same as or different from metal M of the General Formula 1, R is an alkyl group, and m is an integer of 2 to 6.

When the mixture of the material represented by General Formula 1 and the material represented by General Formula 3 is used, an alkoxy group of the material represented by General Formula 3 may interact with the second material and may also interact with an alkoxy group of the material represented by General Formula 1 to form a network of O-M-O bonds. As a result, a film made of the first material may have various properties and functions. For example, when M of General Formula 1 is Si and M of General Formula 3 is Ti or Zr representing compounds known to have a high refractive index, films possessing a wide variety of refractive indices may be obtained by variation in a mixing ratio of the two materials.

As the first material, a compound represented by General Formula 4 wherein a part of a functional group X of General Formula 1 may be substituted with a functional group R' having low or no reactivity may be used.

$$R'_l X_n M(OR)_m \qquad \text{General Formula 4}$$

In General Formula 4, R' is a group having low or no reactivity towards the second layer and may be selected, for example, from a monocyclic or a polycyclic aromatic group such as a pentalenyl group, a phenyl group, an indenyl group, an azulenyl group, a heptalenyl group, an indacenyl group, a fluorenyl group, a phenalenyl group, a naphthyl group, an anthranyl group, a phenanthrenyl group, a pyrenyl group, a chrysenyl group, a picenyl group, a perylenyl group, and the like, a group including a combination of aromatic rings connected with a covalent bond such as a biphenyl group, a terphenyl group, and the like, and an aromatic group in which at least one carbon atom is substituted with a heteroatom such as nitrogen (N), phosphorus (P), oxygen (O), sulfur (S), selenium (Se), and the like.

In General Formula 4, n, m, and l are independently integers wherein n+m+l=2 to 6.

When a compound represented by the General Formula 4 is used as the first material, a network of O-M-O bonds of a metal alkoxide compound may be formed like with the compound represented by General Formula 1.

The properties of the first layer may vary depending on the nature of substituent R' of General Formula 4. For example, when R' is the functional group described above, a layer including R' as a part of an O-M-O network may be obtained. As a result, the layer including R' may have improved flexibility compared to a layer without R'. In addition, optical properties of the first layer may vary depending on the nature of substituent R'.

The second layer 120 may be a layer made of the second material. The second material may be a material that may interact with the at least two kinds of functional groups of the first material as described above.

The second material may include two kinds of functional groups that interact with the functional groups of the first material. As shown in FIG. 1A, the second material B may include functional groups X' and Y' that may interact with (bond to) the functional groups X and Y of the material A as the first material.

When at least one kind of functional groups of the first material is a functional group that is electrostatically chargeable with a positive charge or a negative charge, the second material may be electrostatically chargeable with an opposite charge opposite to the charge of the functional group of the first material. In an embodiment, such a second material may include at least one non-charged functional group which is capable of interacting with the at least one of functional groups of the first material.

An example of the second material may be an electrostatically chargeable particle having at least one kind of a functional group that may interact with at least one functional group of the first material. The functional group may be on at least a portion of the surface of the particle. For example, as shown in FIG. 1B, the second material B may include a non-charged functional group Y' that may interact with (bond to) the functional group Y of the first material A. In an embodiment, the second material B may be negatively charged as opposed to the positively charged functional group X+ of the first material A. Thus, the negatively charged second material B may interact with the positively charged functional group X+ of the first material A through an electrostatic force.

A compound having at least one functional group that is electrostatically chargeable with a charge opposite to the charge of the functional group of the first material and also simultaneously interacts with the functional group of the first material may be, for example, at least one selected from a clay mineral, a phosphate salt-based compound, and a layered plural hydrate. A particle of the clay mineral or the phosphate salt-based compound may have a hydroxy group attached to at least one part of the surface and simultaneously may bear a negative charge. A layered double hydroxide ("LDH") particle may have a hydroxy group attached to at least one part of the surface and may simultaneously bear a positive charge.

The clay mineral may be natural clay and/or synthetic clay, for example, the clay mineral may be at least one selected from mica, vermiculite, montmorillonite, iron montmorillonite, beidellite, saponite, hectorite, stevensite, and nontronite. The clay mineral may have a sheet-shaped structure, and may be, for example, an inorganic polymer compound having a single silicate tetrahedral sheet or a stacked crystalline structure of a silicate tetrahedral sheet and a sheet of aluminum, magnesium, or iron octahedral sheet. As a similar inorganic layered compound, a composite oxide such as kanemite, layered titanate, layered niobate, layered tantalite, and layered titanoniobate, and the like may be used.

The phosphate salt-based compound may include, for example, zirconium phosphate. The zirconium phosphate may have a sheet shape wherein a zirconium atom plane is formed on a net. Phosphoric acid groups in such a phosphate salt-based compound may be positioned above and under the zirconium atom plane, and a layered crystalline main body may bear a negative charge in a form of $Zr_n(PO_4)_{2n}^{2-}$. Ion exchangeable protons may be positioned between each layer.

The layered double hydroxide ("LDH") may include, for example, a compound represented by the following General Formula 1.

$$[M^{2+}1-xM^{3+}x(OH)_2]x+[B^{n-}x/n \cdot yH_2O]x- \qquad \text{General Formula 1}$$

In General Formula 1, $M^{2+}$ is a divalent metal, $M^{3+}$ is a trivalent metal, $B^{n-}$ is an anion, n is a valence of the anion, 0<x<0.4, and y is a real number of greater than 0.

Thus, the layered double hydroxide may be a sheet-shaped structured compound including a negatively electrostatically chargeable interlayer ($[B^{n-}x/n \cdot yH_2O]_x-$) including an anion and water molecules between layers of primary layers $[M^{2+}1-xM^{3+}x(OH)_2]x+$) of positively electrostatically chargeable brucite. The layered double hydroxide is positively electrostatically chargeable and thus naturally possesses electrical properties.

The divalent metal may include magnesium (Mg), manganese (Mn), iron (Fe), cobalt (Co), nickel (Ni), copper (Cu), zinc (Zn), and the like, and the trivalent metal may include aluminum (Al), iron (Fe), chromium (Cr), cobalt (Co), indium (In), and the like. The anion may include $OH^-$, $F^-$, $Cl^-$, $NO_3^-$, $SO_4^{2-}$, $CO_3^{2-}$, $Fe(CN)_6^{4-}$, $CH_3COO^-$, $V_{10}O_{28}^{6-}$, $C_{12}H_{25}SO^{4-}$, and the like.

The following Table 1 shows examples of the functional groups of the first material and examples of the second material that can interact with the functional groups.

TABLE 1

| Examples of the functional group of the first material | Examples of the second material |
| --- | --- |
| Nitrogen containing group, for example aminoalkyl | Compound having a carboxyl group |
| | Compound having a phosphoric acid group |
| | Compound having a sulfonic acid group |
| | Compound having an isocyanate group |
| | Compound having a urea group |
| | Negatively electrostatically chargeable particle |
| Alkoxy group | Compound having a hydroxy group |
| | Compound having a carboxyl group |
| | Compound having a phosphoric acid group |
| | Compound having a sulfonic acid group |
| | Compound having an isocyanate group |
| | Compound having a urea group |
| Isocyanate group | Compound having a carboxyl group |
| | Compound having a phosphoric acid group |
| | Compound having a sulfonic acid group |
| | Compound having an isocyanate group |
| | Compound having a urea group |
| Epoxy group | Compound having a hydroxy group |
| | Compound having a carboxyl group |
| | Compound having a phosphoric acid group |
| | Compound having a sulfonic acid group |
| | Compound having an isocyanate group |
| | Compound having a urea group |
| Urea group | Compound having a hydroxy group |
| | Compound having a carboxyl group |
| | Compound having a phosphoric acid group |
| | Compound having a sulfonic acid group |
| | Compound having an isocyanate group |
| Unsaturated group, e.g., vinyl or allyl group | Compound having an unsaturated group |

Referring to Table 1, when the first material includes, for example an alkoxy group and an aminoalkyl group, the second material may have a hydroxy group and simultaneously have a carboxyl group, or may be electrostatically chargeable with a negative charge.

Combinations of the first material and the second material are shown in the following Table 2.

TABLE 2

| First material | Second material |
| --- | --- |
| Metal alkoxide having an amino group/ | Layered compound having a hydroxy group on a part or the whole of the surface or being |

TABLE 2-continued

| First material | Second material |
| --- | --- |
| aminopropyltriethoxy silane (APTES) | negatively electrostatically charged montmorillonite |
| | saponite |
| | zirconium phosphate (α-ZrP) |
| | heteropoly acid, and polyphosphoric acid such as carbonate, layered titanate, vanadate, molybdate, tungstate, and the like |
| Metal alkoxide having an isocyanate group/3-isocyanatepropyl-triethoxysilane | Layered compound having a hydroxy group on a part or the whole of the surface montmorillonite |
| | α-ZrP |
| | heteropoly acid, and polyphosphoric acid such as kanemite, layered titanate, vanadate, molybdate, tungstate, and the like |
| Metal alkoxide having an epoxy group/3-glycidoxypropylmethyl-dimethoxysilane | Layered compound having a hydroxy group on a part or the whole of the surface montmorillonite |
| | α-ZrP |
| | heteropoly acid, and polyphosphoric acid such as kanemite, layered titanate, vanadate, molybdate, tungstate, and the like |
| Metal alkoxide having an urea group/ 3-ureidepropyltriethoxysilane | Layered compound having a hydroxy group, an amino group, or a carboxyl group on a part or the whole of the surface montmorillonite |
| | α-ZrP |
| | heteropoly acid, and polyphosphoric acid such as kanemite, layered titanate, vanadate, molybdate, tungstate, and the like |
| Metal alkoxide having a polymerizable double bond/ vinyltrimethoxysilane/ p-styryltrimethoxysilane | Layered compound having a hydroxy group on a part or the whole of the surface montmorillonite |
| | α-ZrP |
| | heteropoly acid, and polyphosphoric acid such as kanemite, layered titanate, vanadate, molybdate, tungstate, and the like |

A multi-layer thin film assembly 100 may have a thickness of less than or equal to about 50 nanometers ("nm"), specifically, from about 5 to about 50 nm, more specifically, from about 5 nm to about 30 nm. When the multi-layer thin film assembly 100 has thickness in the foregoing ranges, good gas barrier performance, for example a water vapor transmission rate of less than or equal to 0.5 gram per square meter per day ("g/m²/day"), may be achieved.

The structure of the multi-layer thin film assembly 100 including the first layer 110 and the second layer 120 stacked on the substrate 101 may be confirmed, for example, by an atomic force microscope ("AFM") photograph. Thickness in each individual case may be measured using an ellipsometer.

Hereinafter, referring to FIGS. 4A to 4D, a method of manufacturing the multi-layer thin film assembly 100 according to an embodiment is described.

FIGS. 4A to 4D are diagrams sequentially showing a method of manufacturing a multi-layer thin film assembly according to an embodiment.

Herein, the first material may be a material A including a functional group X and a functional group Y, and the second material may be a material B including a functional group X' and a functional group Y' which are capable of interacting with a functional group X and a functional group Y, respectively. The first material A and the second material B may be formed on the substrate 101 using, for example, an alternate adsorption method.

First, the substrate 101 is surface-treated so that the first material A may be adsorbed thereon.

Figure 4A:
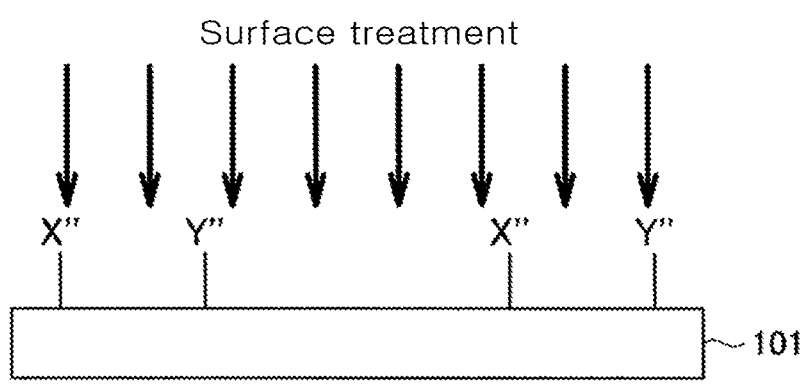
FIGS. 4A to 4D are diagrams sequentially showing a method of manufacturing a multi-layer thin film assembly according to an embodiment.

As shown in FIG. 4A, at least one of the functional groups X" that interacts with the functional group X of the first material A, and a functional group Y" that interacts with the functional group Y of the first material A, may be introduced on the substrate 101. When the substrate 101 has at least one of the functional group X" and the functional group Y" on its surface, the substrate 101 may adsorb the first material A, and therefore does not need surface treatment.

The surface treatment may, for example, be physical treatment such as corona treatment, UV/$O_3$ treatment, and the like, electron beam ("EB") treatment, or chemical treatment, for example, treatment with a chemical solution such as a silane coupling agent.

When the substrate 101 is an inorganic material such as glass or a surface-oxidized silicon wafer, the substrate 101 may have a hydroxy group that interacts with the first material A, and thus surface treatment may not be needed. When such a substrate 101 is treated with corona discharge or UV/$O_3$, a surface of the substrate 101 is derivatized with hydroxy groups so that the hydroxy groups may cover the surface of the substrate 101 uniformly. The substrate 101 with the attached hydroxy groups may be negatively charged in an aqueous solution.

When the substrate 101 is made of an organic material such as a resin film, the surface of the resin film may be derivatized to produce hydroxy groups attached to the surface through surface treatment such as corona treatment, UV/$O_3$ treatment, electron beam ("EB") treatment, and the like.

As described above, after the hydroxy group is introduced on the surface of the substrate 101, the substrate 101 may be surface-treated with a silane coupling agent containing a functional group (e.g., an amino group) as well as an alkoxy group, and the functional group may be introduced onto the surface of the substrate 101. For example, when the substrate 101 having a hydroxy group is surface-treated using a silane coupling agent containing an amino group, the silane coupling agent may bond with the hydroxy group on the surface of the substrate 101. As a result, the amino group may be ionized to become positively charged. Accordingly, the surface of the substrate 101 may become uniformly positively charged.

Depending on the nature of the functional group attached to the surface of the substrate 101 and the functional groups of the first material A and second material B, either the first material A or the second material B may be formed first. For example, when the substrate 101 has the functional group X" that may interact with the functional group X on the surface of the material A, the material A is formed first.

Hereinafter, as the first layer 110, the first material A is formed first. However, it should be understood that the second material B may also be formed first.

Figure 4B:
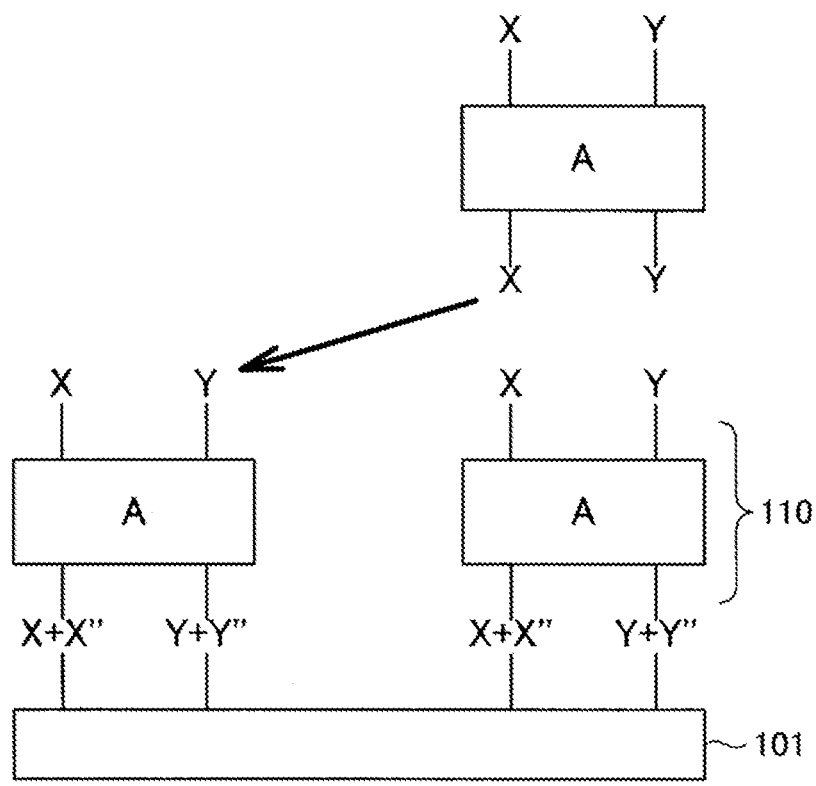

FIG. 4B illustrates a preparation of the first layer 110 made of the first material A on the surface-treated substrate 101. Specifically, the first material A may be dissolved or dispersed to form a material solution. The material solution has a concentration of about 100 nanomole per liter ("nmol/L") to about 1 millimole per liter ("mmol/L"), about 0.01 gram per liter ("g/L") to about 10 g/L, about 1 micromole per liter ("µmol/L") to about 100 µmol/L, or about 0.1 g/L to about 1 g/L. Within the foregoing concentration ranges, the solution may have a desirable viscosity in order for the first material A to be adsorbed on the surface of the substrate 101.

The surface-treated substrate 101 may then be dipped into the material solution. As shown in FIG. 4B, the first material A may be adsorbed on the surface of the substrate 101 through an interaction between the functional group X of the first material A and the functional group X" of the surface of the substrate 101, an interaction between the functional group Y of the material A and the functional group Y" of the surface of the substrate 101, and/or both of these interactions.

As can be observed from FIG. 4B, a chemical bond between the functional group X and the functional group X" is produced through an interaction between the functional group X of the first material A and the functional group X" of the surface of the substrate 101, and a chemical bond between the functional group Y and functional group Y" is produced through an interaction between the functional group Y of the first material A and the functional group Y" of the surface of the substrate 101. As a result, the first layer 110 is formed on the substrate 101.

Referring to FIG. 3, when a plurality of functional groups X interact with each other, the first material A bonds to another first material A to form a network of the first materials A which may form the first layer 110.

Figure 4C:
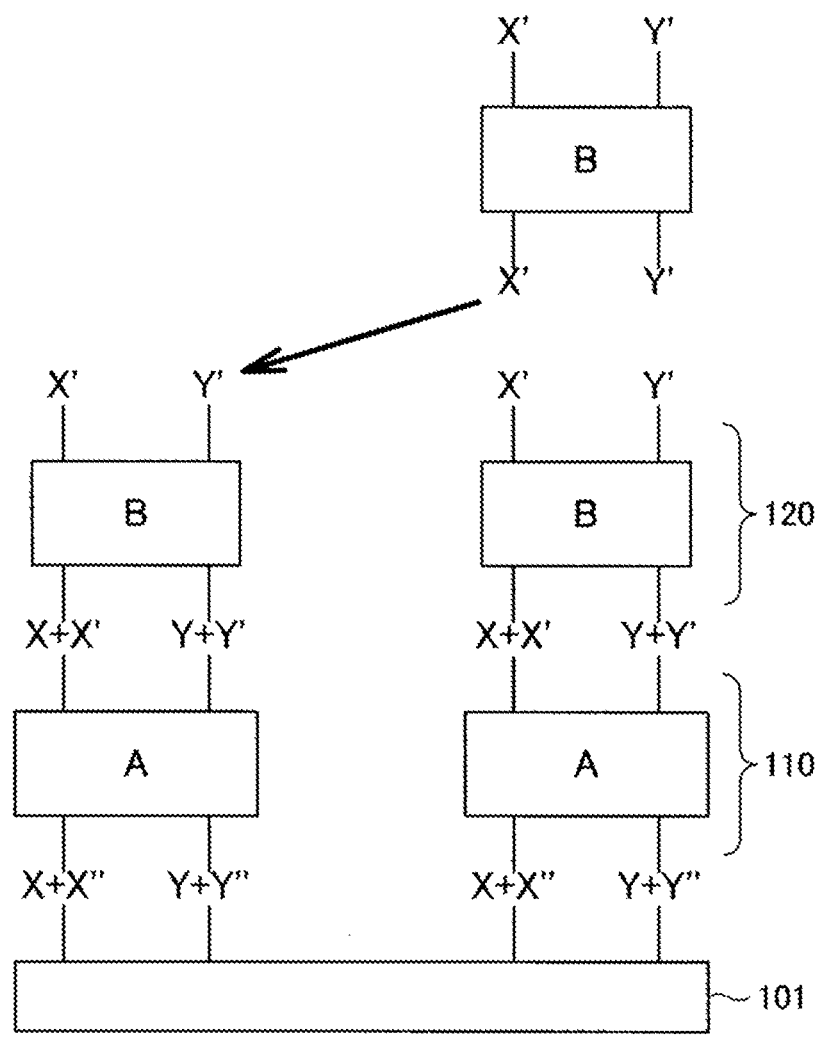

Referring to FIG. 4C, the second layer 120 made of the material B may be formed on the first layer 110 made of the material A. Specifically, the second material B is dissolved or dispersed to prepare a second material B solution. The second material B solution has a concentration of about 100 nmol/L to about 1 mmol/L, about 0.01 g/L to about 10 g/L, about 1 µmol/L to about 100 µmol/L, or about 0.1 g/L to about 1 g/L. Within the foregoing concentration range, the solution may have a desirable viscosity in order for the second material B to be adsorbed on the surface of the first layer 110.

The substrate 101 including the first layer 110 thereon may then be dipped into the second material B solution. As shown in FIG. 4C, the second material B may be adsorbed on the surface of the first layer 110 through an interaction between the functional group X' of the second material B and the functional group X of the first material A, interaction between the functional group Y' of the second material B and the functional group Y of the first material A, and/or both of these interactions.

In FIG. 4C, a chemical bond between the functional group X' and the functional group X is produced through an interaction between the functional group X' of the second material B and the functional group X of the first material A, and a chemical bond between the functional group Y' and the functional group Y is produced through an interaction between the functional group Y' of the second material B and the functional group Y of the first material A. As a result, the second layer 120 may be formed on the first layer 110.

Figure 4D:
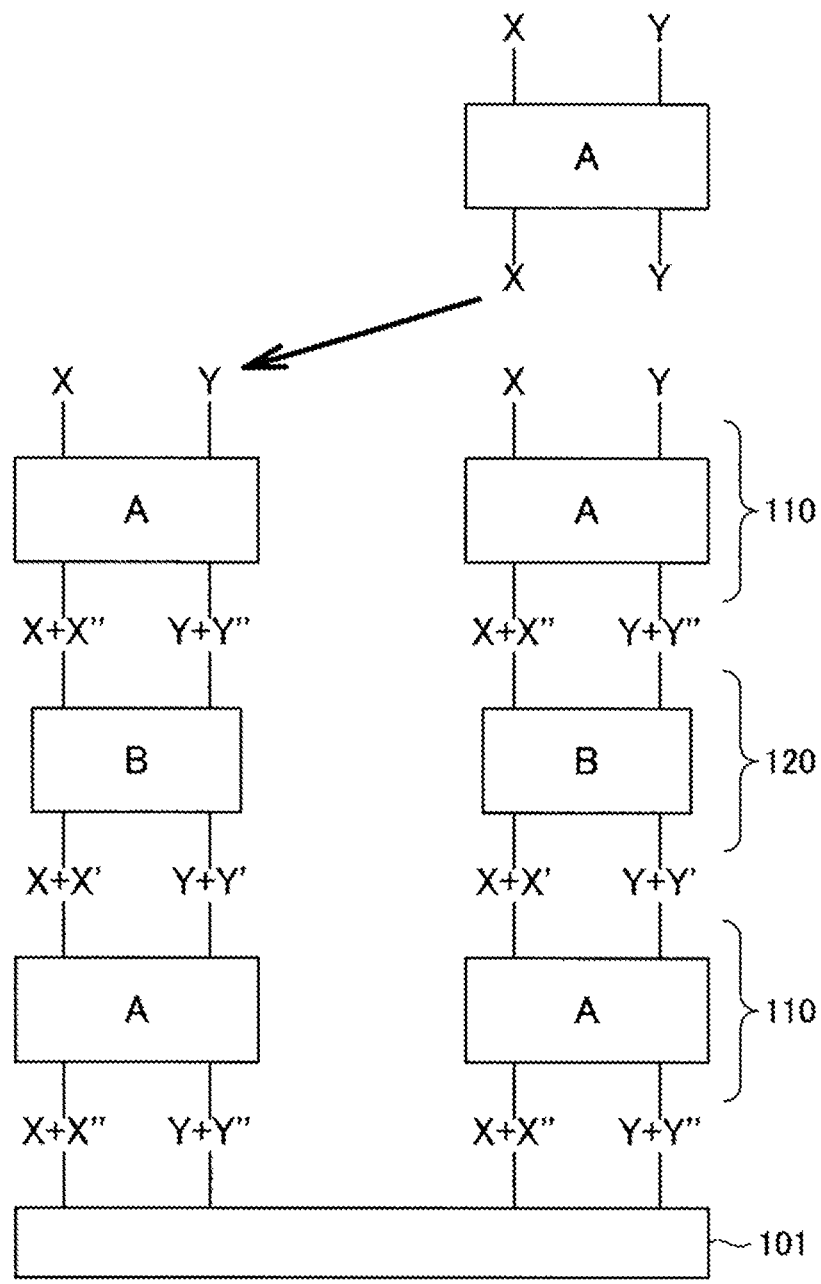

As shown in FIG. 4D, the first layer 110 made of the second material B may be formed on the second layer 120 wherein the second layer 120 includes the first material A. Specifically, the first material A may be dissolved or dispersed to prepare a first material A solution. Then the substrate 101 including the first layer 110 and the second layer 120 may be dipped into the first material A solution. As further shown in FIG. 4D, the first material A may be adsorbed on the surface of the second layer 120 through an interaction between the functional group X of the first material A and the functional group X' of the second material B, an interaction between the functional group Y of first material A and the functional group Y' of the second material B, and/or both of these interactions.

As illustrated in FIG. 4D, a chemical bond between the functional group X and functional group X' may be produced through an interaction between the functional group X of the first material A and the functional group X' of the second material B, and a chemical bond between the functional group Y and the functional group Y' may be produced through an interaction between the functional group Y of the first material A and the functional group Y' of the second material B. As a result, the first layer 110 may be formed on the second layer 120.

Subsequently, a formation of the second layer 120 on the first layer 110 and a formation of the first layer 110 on the second layer 120 may be repeated so that the first layer 110 and second layer 120 are alternately stacked on the substrate 101 to produce a predetermined number of layers. As a result, at least one of the first layer 110 and at least one of the second layer 120 may be alternately stacked on the substrate 101 using an adsorption method to produce a multi-layer thin film assembly 100.

Hereinafter, referring to FIGS. 5A to 5D, a method of manufacturing a multi-layer thin film assembly 100 according to another embodiment is described.

FIGS. 5A to 5D are diagrams sequentially showing a method of manufacturing a multi-layer thin film assembly according to another embodiment.

In an embodiment, the first material may be a material A having an electrostatically chargeable functional group X and an electrostatically non-chargeable functional group Y, and the second material may be a material B having a functional group Y' that can interact with (or bond to) the functional group Y and simultaneously being electrostatically chargeable with a charge opposite to the functional group X. The first material A and the second material B may be formed on the substrate 101 using an alternate adsorption method described above.

Figure 5A:
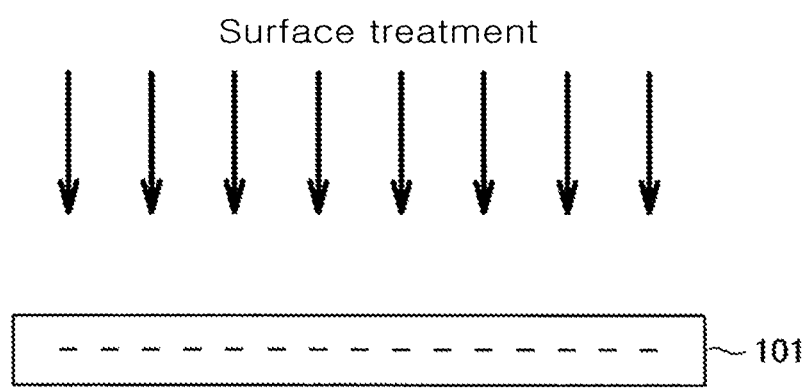
FIGS. 5A to 5D are diagrams sequentially showing a method of manufacturing a multi-layer thin film assembly according to another embodiment.

First, the substrate 101 may be surface-treated so that the first material A may be adsorbed thereon. As shown in FIG. 5A, the surface of the substrate 101 may be electrostatically charged with a charge opposite to that of the functional group X of the first material A. When the substrate 101 is electrostatically charged with a charge opposite to that of the functional group X on the surface, the substrate 101 may adsorb the first material A, and does not need surface treatment.

The surface treatment may, for example, be physical treatment such as corona treatment, UV/$O_3$ treatment, and the like, electron beam ("EB") treatment, or chemical treatment, for example, with a chemical solution such as a silane coupling agent.

When the substrate 101 is an inorganic material such as glass or a surface-oxidized silicon wafer, the substrate 101 has a hydroxy group that interacts with the first material A and thus surface treatment may not be needed. When such a substrate 101 is treated with corona discharge or UV/$O_3$, a surface of the substrate 101 may be derivatized with hydroxy groups so that the hydroxy groups may cover the surface of the substrate 101 uniformly. The substrate 101 with the attached hydroxy groups may be negatively charged in an aqueous solution.

When the substrate 101 is made of an organic material such as a resin film, the surface of the resin film may be derivatized to produce a hydroxy group through surface treatment such as corona treatment, UV/$O_3$ treatment, electron beam ("EB") treatment, and the like.

As described above, after the hydroxy group is introduced on the surface of the substrate 101, the substrate 101 may be surface-treated with a silane coupling agent containing a functional group as well as an alkoxy group, and the functional group may be introduced on the surface of the substrate 101. For example, when the substrate 101 having a hydroxy group is surface-treated using a silane coupling agent containing an amino group, the silane coupling agent bonds with the hydroxy group on the surface of the substrate 101. As a result, the amino group may be ionized and may obtain a positive charge. Accordingly, the surface of the substrate 101 may become uniformly positively charged.

Depending on the nature of the functional group attached to the surface of the substrate 101 and the functional groups of the first material A and the second material B, either the first material A or the second material B may be formed first. For example, when the substrate 101 has the functional group X" that may interact with the functional group X on the surface of the first material A, the first material A is formed first.

Hereinafter, as the first layer 110, the first material A may be formed first. However, it should be understood that the material B may also be formed first.

Figure 5B:
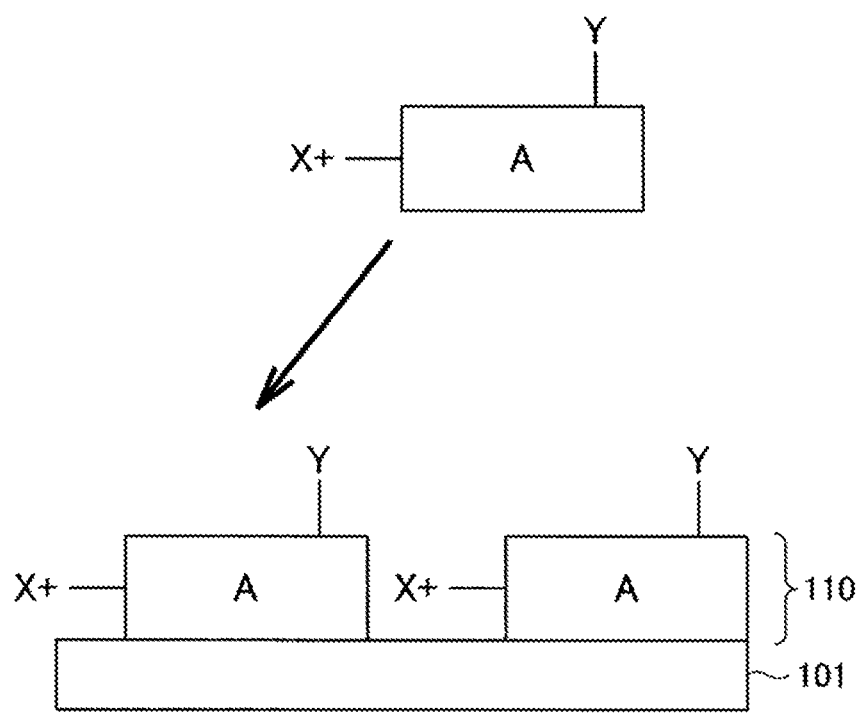

FIG. 5B illustrates a preparation of the first layer 110 made of the first material A on the surface-treated substrate 101. Specifically, the material A may be dissolved or dispersed to form a first material A solution. The first material A solution may have a concentration of the first material A as described above.

The surface-treated substrate 101 may then be dipped into the material solution. As shown in FIG. 5B, a positively charged functional group (in FIG. 5B, a functional group X+) of the first material A is attracted to the surface of the substrate 101 that is negatively charged through electrostatic force, so the first material A becomes adsorbed on the surface of the substrate 101. As further shown in FIG. 5B, the functional group X+ of the first material A may interact with the surface of the substrate 101, and the positive charge of the functional group X+ and a negative charge of the surface of the substrate 101 surface may produce electrostatic force. As a result, the first layer 110 may be formed on the substrate 101.

Referring to FIG. 3, when a plurality of functional groups X+ interact with each other, the first material A may bond to another first material A in a network fashion and may form the first layer 110.

Figure 5C:
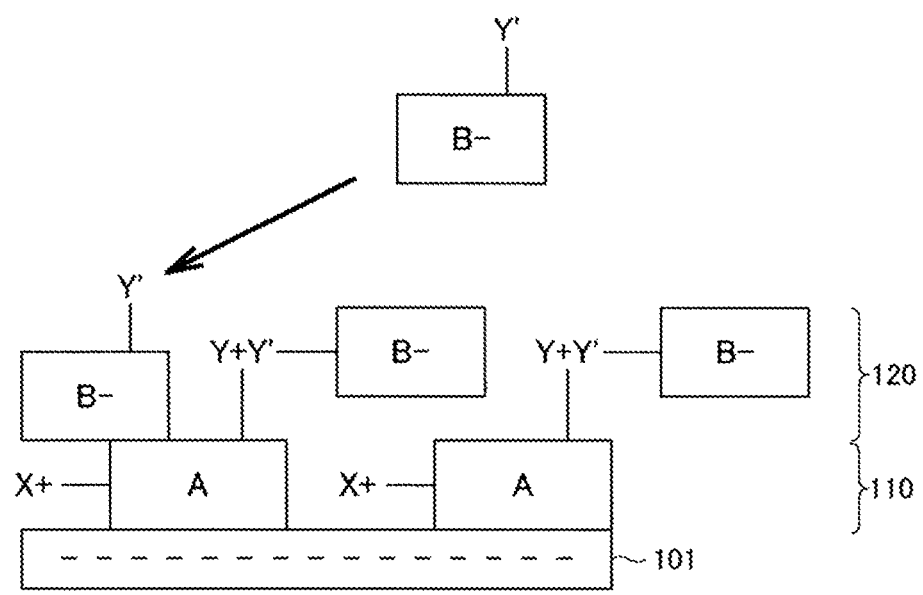

Referring to FIG. 5C, the second layer 120 made of the second material B may be formed on the first layer 110 wherein the first layer 110 includes the first material A. Specifically, the second material B may be dissolved or dispersed to prepare a second material B solution. The material B solution may have a concentration of the material A as described above.

The substrate 101 including the first layer 110 may be dipped into the second material B solution. As shown in FIG. 5C, the non-charged functional group Y' of the second material B may interact with the non-charged functional group Y of the first material A and simultaneously the electrostatically charged material B may be attracted to the functional group X+ of the first material A that has a charge opposite to the charge of the second material B through electrostatic force, so the second material B may be adsorbed on the surface of the first layer 110.

In FIG. 5C, through an interaction between the first material A and the second material B, two kinds of interactions may be generated: electrostatic force between the positive charge of the functional group X+ of the first material A and the negative charge of the second material B, and a chemical bond between the non-charged substituent Y of the first material A and the non-charged substituent Y' of the second material B. Accordingly, the second layer 120 may be formed on the first layer 110.

Figure 5D:
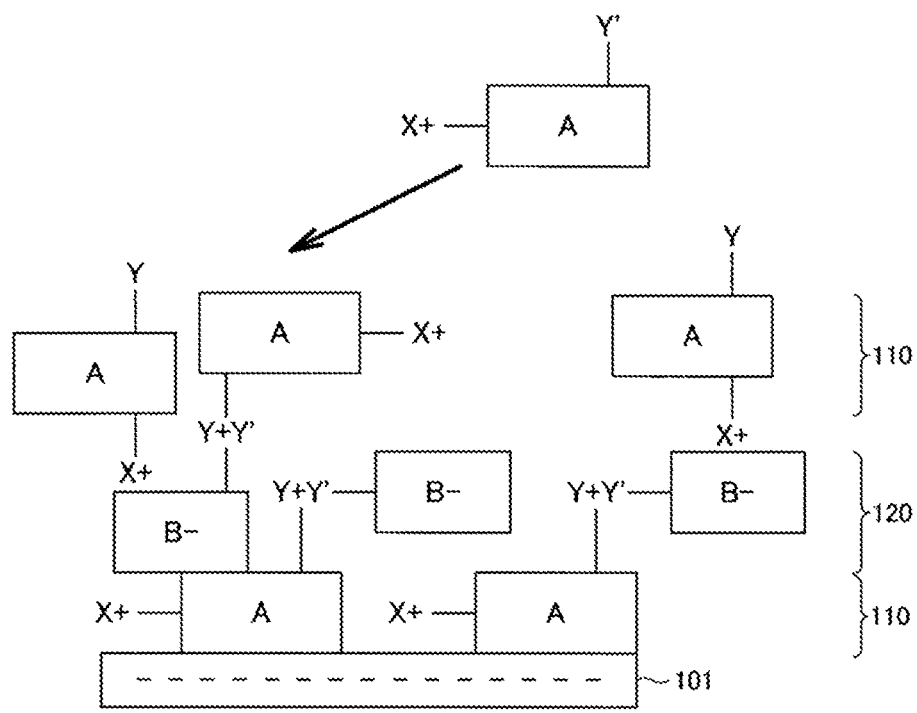

Referring to FIG. 5D, the first layer 110 made of the first material A may be formed on the second layer 120 made of the second material B. Specifically, the first material A may be dissolved or dispersed to form a material solution. Then the substrate 101 including the first layer 110 and the second layer 120 may be dipped into the material solution. As shown in FIG. 5D, the non-charged functional group Y of the first material A may interact with (bonds to) the non-charged functional group Y' of the second material B and simultaneously the substituent X+ of the electrostatically charged first material A may be attracted to the material B, that has a charge opposite to the charge of the substituent X+ of the first material A, through electrostatic force, so the first material A may be adsorbed on the surface of the second layer 120.

In FIG. 5D, through an interaction between the second material B and the first material A, two kinds of interactions may be generated: electrostatic force between the negatively charged second material B and the positive charge of the functional group X+ of the first material A, and a chemical bond between the non-charged substituent Y' of the second material B and the non-charged substituent Y of the first material A. As a result, the first layer 110 may be formed on the second layer 120.

Subsequently, formation of the second layer 120 on the first layer 110 and formation of the first layer 110 on the second layer 120 may be repeated so that the first layer 110 and second layer 120 are alternately stacked on the substrate 101 to produce a predetermined number of layers. As a result, at least one of the first layer 110 and at least one of the second layer 120 may be alternately stacked on the substrate 101 using an adsorption method to produce a multi-layer thin film assembly 100.

Hereinafter, a barrier film manufactured using the multi-layer thin film assembly 100 is described.

The barrier film may be used for a substrate of a flat panel display ("FPD"), lights, light emitting devices, and the like. The substrate 101 may be a resin film so the multi-layer thin film assembly 100 may be formed on the resin film. The barrier film having barrier performance may be manufactured by using an inorganic layered compound as the second material of the multi-layer thin film assembly 100. The inorganic layered compound suppresses transmission of water vapor or gases such as oxygen invading the barrier film through a resin film, so the multi-layer thin film assembly 100 including the inorganic layered compound may have good barrier performance to suppress transmission of gases.

The multi-layer thin film assembly 100 may include the first material and the second material adsorbed through at least two interactions. The multi-layer thin film assembly 100 may have excellent close contacting properties between layers and may provide a high density thin film compared to a film having a multi-layered heterostructure formed by only one kind of an interaction. As a result, the barrier film or optical device including the multi-layer thin film assembly 100 may have improved performance and durability.

The multi-layer thin film assembly 100 includes the first material having at least one kind of the functional groups and thus the first material may bond to itself to provide a network fashioned thin film. Accordingly, a high density thin film may be formed. As a result, the barrier film or optical device including the multi-layer thin film assembly 100 may have improved performance and durability.

Herein, a structure of the network may be controlled and a thin film having a multi-layered heterostructure including various structured thin film may be manufactured by selecting desirable functional groups of the first material. Particularly, a compound including a functional group having a plurality of bonding valences such as metal alkoxide or phosphoric acid may strongly bind the molecules of the thin film having a heterostructure in addition to a bond with a layered compound. In addition, the first material includes a material A mixed with the material C that may form a network with the material A, and provides a thin film having various properties. Accordingly, applied ranges of the multi-layer thin film assembly 100 may become wide.

Hereinafter, the embodiments are illustrated in more detail with reference to examples. However, the following examples are only exemplary embodiments and therefore are not limiting.

Example 1

1) Cleaning of Substrate

A silicon wafer oxidized on the surface (#500452, Nilaco Co.) was dipped in a Piranha solution ($H_2O_2$:concentrated sulfuric acid=1:1) for 24 hours and then cleaned with distilled water and dried with an air blower.

2) Preparation of First Material Solution

A first material solution including 100 millimolar ("mM") of aminopropyltriethoxysilane was prepared by mixing aminopropyltriethoxysilane ("APTES") as poly-cations with ethanol. The mixture was subsequently agitated.

3) Preparation of Second Material Solution

A second material solution as an aqueous solution including montmorillonite dispersed therein was prepared by putting 0.5 g of montmorillonite ("MMT") (Kunifil-D36, Kunimine Industries Co.) in 1 liter ("L") of distilled water and agitating the mixture with a commercially-available stirrer (KNS-T1, manufactured by AsOne) for a day.

4) Formation of First Layer

The first layer was formed by dipping the substrate prepared according to 1) into the first material solution prepared according to 2) at room temperature for 30 minutes, and then sequentially cleaning the substrate with ethanol and distilled water and drying the substrate with an air blower.

Figure 6A:
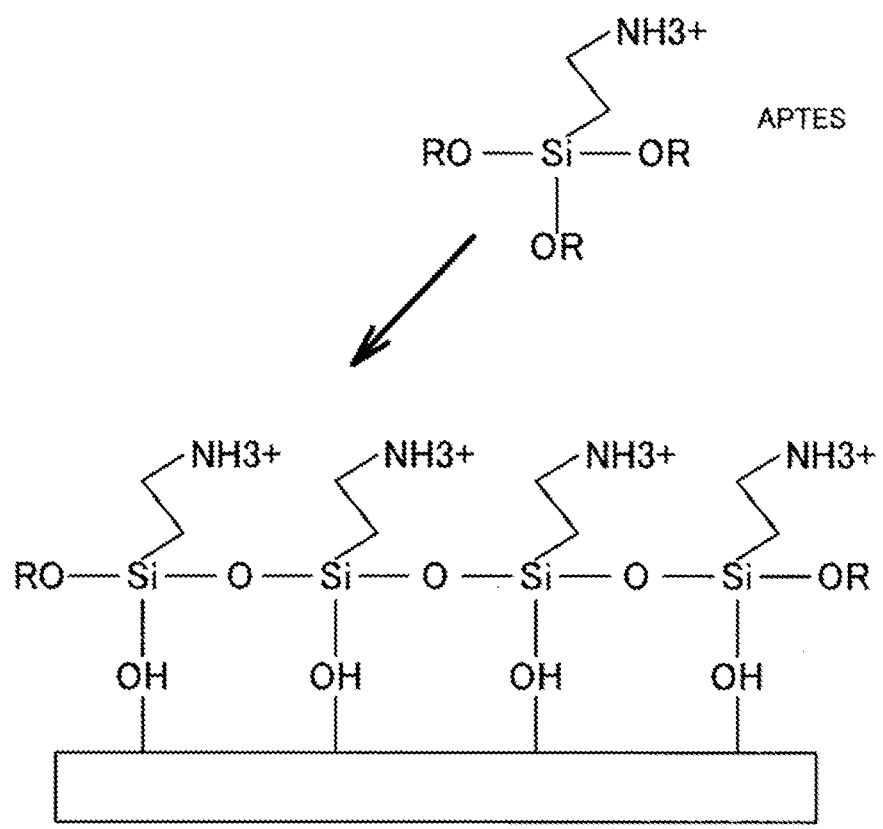
FIG. 6A is a schematic view showing an adsorption status and a shape of the first layer according to Example 1.

FIG. 6A shows the adsorption state and shape of the first layer.

5) Formation of Second Layer

Figure 6B:
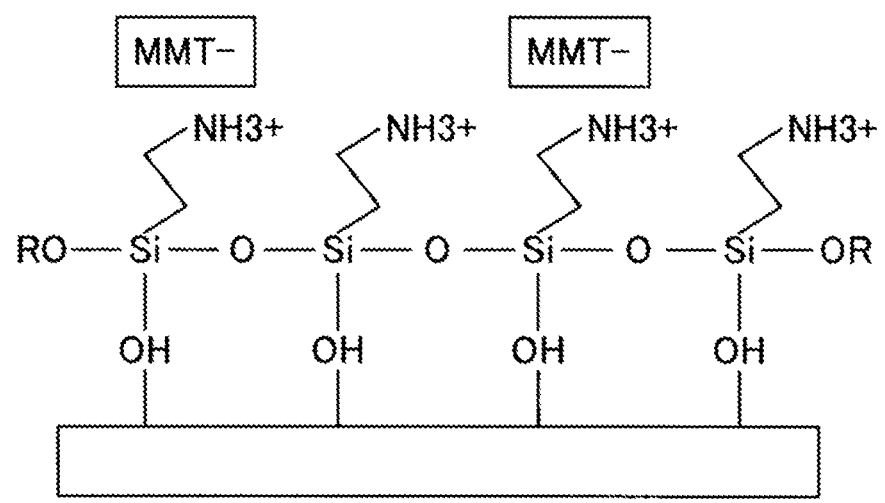
FIG. 6B is a schematic view showing an adsorption status and a shape of the second layer according to Example 1.

A second layer was formed by dipping the substrate including the first layer prepared according to 4) into the second material solution prepared according to 3) at room temperature for 15 minutes, and then cleaning the resulting material with distilled water and drying it with an air blower. FIG. 6B shows the adsorption state and shape of the second layer.

6) Alternate Adsorption

Figure 6C:
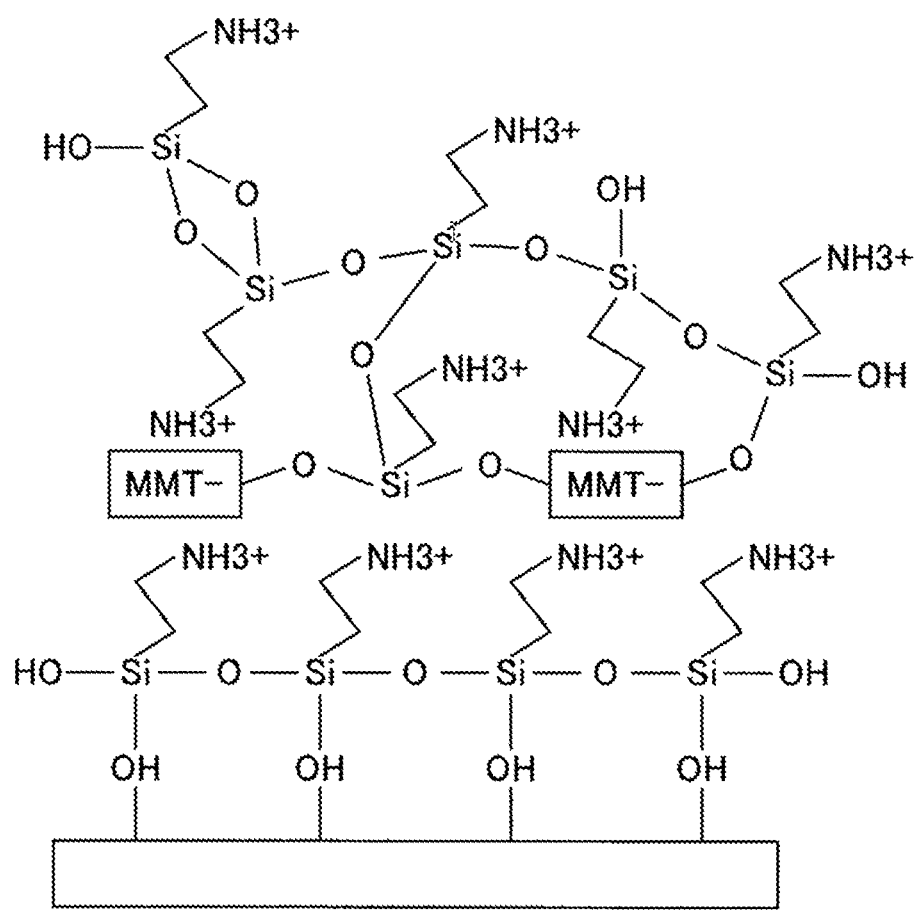
FIG. 6C is a schematic view showing an adsorption status and a shape of the alternately stacked layer according to Example 1.

Three samples were prepared by repeating the processes described in 4) and 5) 5 times, 10 times, and 20 times to alternately adsorb the first and second layers until a corresponding unit including the first layer and the second layer was prepared. FIG. 6C shows the stacked state of a substrate including 2 units. The hydroxy groups of the montmorillonite ("MMT") interacting with the hydroxy group from hydrolysis of the aminopropyltriethoxysilane ("APTES") are located on the surface edge of the montmorillonite ("MMT") crystal. Accordingly, the aminopropyltriethoxysilane ("APTES") interacted with an amino group on the flat crystal surface of the montmorillonite ("MMT") and the hydroxy group on the edge surface thereof as shown in FIG. 6C.

The aminopropyltriethoxysilane ("APTES") was adsorbed on the edge surface as well as on the flat crystal surface of the montmorillonite ("MMT") and filled gaps among montmorillonite ("MMT") particles, forming a highly dense thin film.

7) Measurement of Thickness of Alternately Stacked Layer

The thickness of the sample including 5 units of alternately stacked layers according to 4) to 6) was measured every time when the first layer or the second layer was stacked one by one using an ellipsometer NL-ELP (Nippon Laser & Electronics Lab.). In addition, the thicknesses of the samples including 10 units and 20 units of alternately stacked layers were measured by the same method.

8) Evaluation of Adherence of Alternately Stacked Layer

The adherence of the alternately stacked layers in the samples after the process 6) and the measurement 7) was evaluated by a method prescribed by JIS K5400. Specifically, the alternately stacked layers were cut to form a 10×10 grid with a pitch of 1 mm using a cutter. Then, an adhesive tape (CT-18S) was applied to the alternately stacked layers and instantly detached, and then the number of delaminated grids was counted.

Example 2

1) Cleaning of Substrate

A silicon wafer oxidized on the surface (#500452, Nilaco Co.) was dipped in a Piranha solution ($H_2O_2$:concentrated sulfuric acid=1:1) for 24 hours, and then cleaned with distilled water and dried with an air blower.

2) Preparation of First Material Solution

A first material solution including 100 mM of aminopropyltriethoxysilane was prepared by mixing the aminopropyltriethoxysilane ("APTES") as poly-cations with ethanol and agitating the mixture.

3) Preparation of Second Material Solution 1 g of α-ZrP (manufactured by DAIICHI KIGENSO KAGAKU KOGYO) and 150 mL of distilled water were agitated for one day with an agitator. Then, 30 mL of an aqueous solution including 150 mM/L of tetrabutyl ammonium hydroxide was added to the ZrP solution in a small amount to not surpass pH 9 to exfoliate ZrP particles and prepare a second material solution.

4) Formation of First Layer

The substrate according to 1) was dipped in the first material solution prepared according to 2) at room temperature for 30 minutes, and then sequentially cleaned with ethanol and distilled water and dried with an air blower, forming a first layer.

5) Formation of Second Layer

The substrate having the first layer 4) was dipped in the second material solution prepared according to 3) at room temperature for 15 minutes, and then cleaned with distilled water and dried with an air blower to form a second layer.

6) Alternate Adsorption

Three samples were prepared by repeating the processes 4) and 5) to alternately adsorb the first and second layers until a process of unit preparation consisting of the first layer and the second layer has been repeated 5 times, 10 times, and 20 times.

7) Measurement of Thickness of Alternately Stacked Layer

The thickness of the sample including up to 5 units of alternately stacked layers prepared according to 4) through 6) was measured every time the first layer or the second layer was stacked over one another by one using an ellipsometer NL-ELP (Nippon Laser & Electronics Lab.). In addition, the thickness of the samples including 10 units and 20 units of alternately stacked layers were measured by the same method.

8) Evaluation of Adherence of Alternately Stacked Layer

The adherence of the samples of the alternately stacked layers after the process 6) and the measurement 7) was evaluated therein in a method prescribed by JIS K5400. Specifically, the alternately stacked layers were cut to form a 10×10 grid with a pitch of 1 millimeter ("mm") using a cutter. Subsequently, an adhesive tape (CT-18S) was applied to the alternately stacked layers and instantly detached. The number of delaminated grids was counted.

Comparative Example 1

1) Cleaning of Substrate

A silicon wafer oxidized on the surface (#500452, Nilaco Co.) was dipped in a Piranha solution ($H_2O_2$:concentrated sulfuric acid=1:1) for 24 hours, cleaned with distilled water and dried with an air blower.

2) Preparation of First Material Solution

A first material solution was prepared as 30 mM aqueous solution of polyallylamine hydroxide ("PAH").

3) Preparation of Second Material Solution

A second material solution was prepared by putting 0.5 g of montmorillonite ("MMT") (Kunifil-D36, manufactured by Kunimine Industries Co.) in 1 L of distilled water and agitating the mixture with an agitator (KNS-T1, manufactured by AsOne) for one day to give an aqueous solution including the montmorillonite dispersed therein.

4) Formation of First Layer

A first layer was formed by dipping the substrate prepared according to 1) into the first material solution prepared according to the 2) at room temperature for 30 minutes, cleaning the substrate with ethanol and distilled water, and drying it with an air blower.

5) Formation of Second Layer

A second layer was formed by dipping the substrate having the first layer prepared according to 4) into the second material solution prepared according to 3) at room temperature for 15 minutes, cleaning the substrate with distilled water, and drying it with an air blower.

6) Alternate Adsorption

Three samples were prepared by repeating the processes described in 4) and 5) 5 times, 10 times and 20 times, to alternately adsorb the first and second layers until a corresponding unit including the first layer and the second layers was prepared.

7) Measurement of Thickness of Alternately Stacked Layer

The thickness of the sample including 5 units of alternately stacked layers prepared according to 4) through 6) was measured every time that the first layer or the second layer was stacked one by one using an ellipsometer NL-ELP (Nippon Laser & Electronics Lab). In addition, the thickness of the samples including 10 units and 20 units of alternately stacked layers was measured by the same method after completing all the processes.

8) Evaluation of Adherence of Alternately Stacked Layer

The adherence of the samples containing the alternately stacked layers after the process described in 6) and the measurement 7) was evaluated therein in a method prescribed by JIS K5400. Specifically, the alternately stacked layers were cut to form a 10×10 grid with a pitch of 1 mm using a cutter. Then, an adhesive tape (CT-18S) was applied to the alternately stacked layers and instantly detached. The number of delaminated grids was counted.

Example 3

1) Cleaning and Surface-Treatment of Resin Film

A 0.2 mm-thick PEN film (Teonex Q65FA, Teijin DuPont Films Ltd.) was cleaned with a detergent and distilled water and dried with an air blower. Subsequently, the dried PEN film was corona treated using HPS-101 (Japan Studio Technical) for 10 minutes. The corona treatment introduced hydroxy groups on the surface of the PEN film.

2) Preparation of First Material Solution

A first material solution including 100 mM of aminopropyltriethoxysilane was prepared by mixing the aminopropyltriethoxysilane ("APTES") as poly-cations with ethanol and agitating the mixture.

3) Preparation of Second Material Solution

A second material solution as an aqueous solution including montmorillonite dispersed therein was prepared by putting 0.5 g of the montmorillonite ("MMT") (Kunifil-D36, Kunimine Industries Co.) in 1 L of distilled water and agitating the mixture with a commercially-available agitator (KNS-T1, manufactured by AsOne).

4) Formation of First Layer

A first layer was formed by dipping the substrate prepared according to 1) into the first material solution prepared according to 2) at room temperature for 30 minutes, sequentially cleaning the substrate with ethanol and distilled water and drying the substrate with an air blower.

5) Formation of Second Layer

A second layer was formed by dipping the substrate having the first layer prepared according to 4) into the second material solution prepared according to 3) at room temperature for 15 minutes, cleaning the substrate with distilled water and drying the substrate with an air blower.

6) Alternate Adsorption

Three samples were prepared by repeating the processes described in 4) and 5) to alternately adsorb the first and second layers 5 times, 10 times, and 20 times, until a corresponding unit including the first layer and the second layer was prepared.

7) Measurement of Water Vapor Transmission Rate ("WVTR")

The water vapor transmission rate ("WVTR") of the samples prepared according to 6) was measured) at 40° C. and 90% relative humidity ("RH") using a water vapor transmission rate measurement device (AQUATRAN, MOCON Co.).

Example 4

1) Cleaning and Surface-Treatment of Resin Film

A 0.2 mm-thick PEN film (Teonex Q65FA, Teijin DuPont Films Ltd.) was cleaned with a detergent and distilled water and dried with an air blower. The dried PEN film was subsequently corona treated using HPS-101 (Japan Studio Technical) for 10 minutes. The corona treatment introduced hydroxy groups on the surface of the PEN film.

2) Preparation of First Material Solution

A first material solution including 100 mM of aminopropyltriethoxysilane was prepared by mixing aminopropyltriethoxysilane ("APTES") as poly-cations with ethanol and subsequently agitating the mixture.

3) Preparation of Second Material Solution 1 g of α-ZrP (manufactured by DAIICHI KIGENSO KAGAKU KOGYO) and 150 mL of distilled water were mixed and agitated with an agitator for one day. Then, 30 mL of an aqueous solution including 150 millimoles per liter ("mM/L") of tetrabutyl ammonium hydroxide was added to the ZrP solution by a small portions to not surpass pH 9 of the ZrP solution, to exfoliate ZrP particles, and prepare a second material solution.

4) Formation of First Layer

A first layer was formed by dipping the substrate prepared according to 1) into the first material solution prepared according to 2) at room temperature for 30 minutes, and then sequentially cleaning the substrate with ethanol and distilled water, and drying it with an air blower.

5) Formation of Second Layer

A second layer was formed by dipping the substrate having the first layer prepared according to 4) into the second material solution prepared according to 3) at room temperature for 15 minutes, and then cleaning the substrate with distilled water and drying it with an air blower.

6) Alternate Adsorption

Three samples were prepared by repeating the processes described in 4) and 5) to alternately adsorb the first and second layers 5 times, 10 times, and 20 times, until a corresponding unit including the first layer and the second layer was prepared.

7) Measurement of Water Vapor Transmission Rate ("WVTR")

The water vapor transmission rate ("WVTR") of the samples prepared according to 6) was measured at 40° C. and 90% RH") using a water vapor transmission rate measurement device (AQUATRAN, MOCON Co.).

Comparative Example 2

1) Cleaning and Surface-Treatment of Resin Film

A 0.2 mm-thick PEN film (Teonex Q65FA, Teijin DuPont Films Ltd.) was cleaned with a detergent and distilled water subsequently dried with an air blower. The dried PEN film was corona treated using HPS-101 (Japan Studio Technical) for 10 minutes. The corona treatment introduced hydroxy groups on the surface of the PEN film.

2) Preparation of First Material Solution

A first material solution polyallylamine was prepared as an aqueous solution including 30 mM of polyallylamine hydroxide ("PAH").

3) Preparation of Second Material Solution

A second material solution as an aqueous solution including montmorillonite dispersed therein was prepared by placing 0.5 g of the montmorillonite (MMT) (Kunifil-D36, Kunimine Industries Co.) in 1 L of distilled water and agitating the mixture with a commercially available agitator (KNS-T1, manufacture by AsOne).

4) Formation of First Layer

A first layer was formed by dipping the substrate prepared according to 1) into the first material solution prepared according to 2) at room temperature for 30 minutes, and then sequentially cleaning the substrate with ethanol and distilled water and drying it with an air blower.

5) Formation of Second Layer

A second layer was formed by dipping the substrate having the first layer prepared according to 4) into the second material solution prepared according to 3) at room temperature for 15 minutes, and then cleaning the substrate with distilled water and drying it with an air blower.

6) Alternate Adsorption

Three samples were prepared by repeating the processes described in 4) and 5) to alternately adsorb the first and second layers 5 times, 10 times, and 20 times, until a corresponding unit consisting of the first layer and the second layer was prepared.

7) Measurement of Water Vapor Transmission Rate ("WVTR")

The water vapor transmission rate ("WVTR") of the samples prepared according to 6) was measured at 40° C. and 90% RH using a water vapor transmission rate measurement device (AQUATRAN, MOCON Co.).

Evaluation 1: Measurement of Thickness

Figure 7:
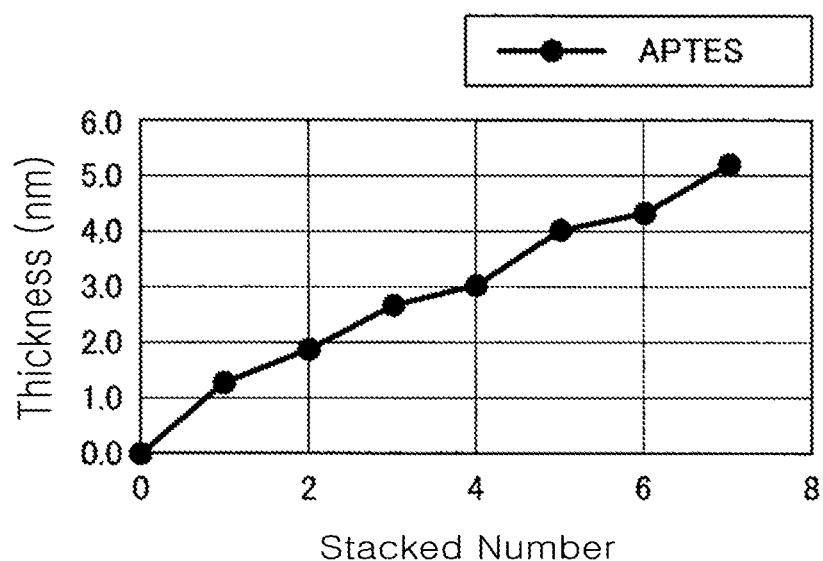
FIGS. 7 to 9 are graphs of thickness (nanometer, m) versus stacked number showing thickness measurements of the samples including 5 units of alternating adsorption layers according to Examples 1 and 2 and Comparative Example 1.
Figure 8:
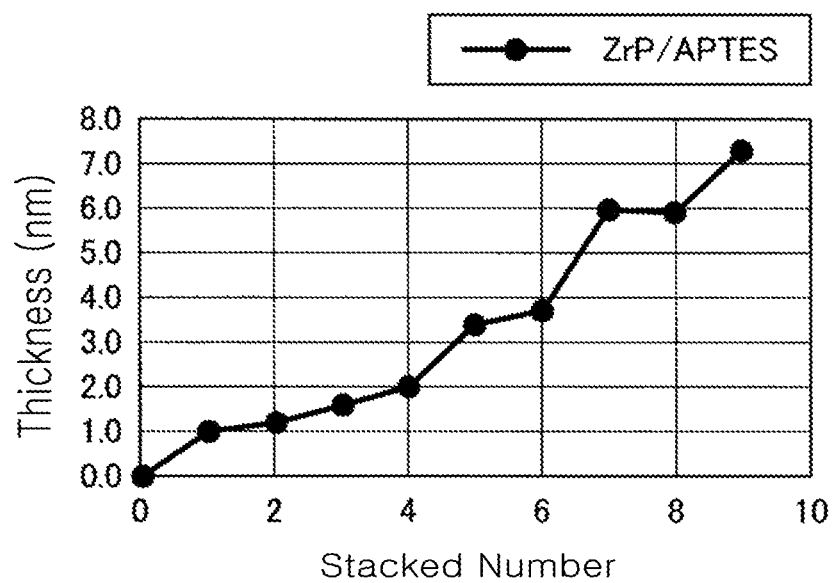
Figure 9:
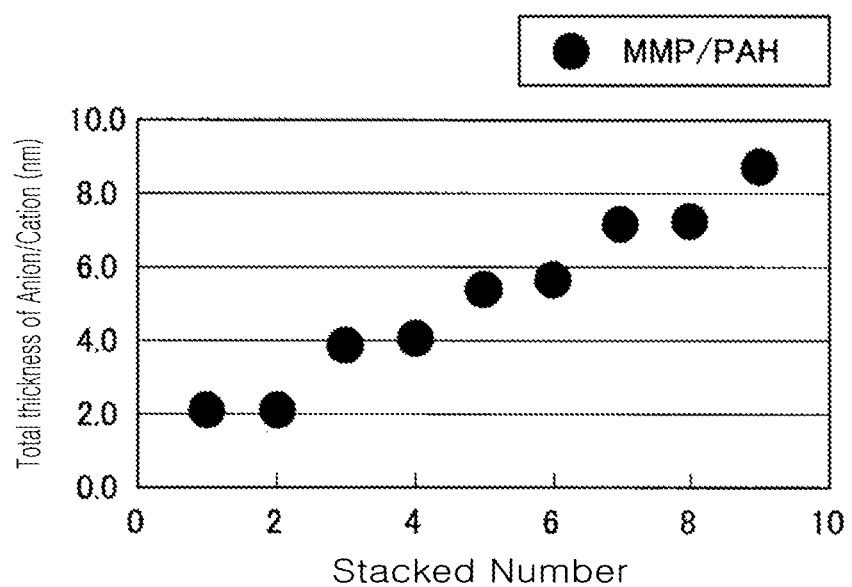

FIGS. 7 to 9 are graphs showing thickness measurement results of the samples including 5 units of adsorption layers prepared according to Examples 1 and 2 and Comparative Example 1.

Referring to FIGS. 7 to 9, the more alternately disposed adsorption layers are present in the samples prepared according to Examples 1 and 2 and Comparative Example 1, the thicker the samples are. In addition, thickness measurements of each sample have been made and are provided in Table 3.

TABLE 3

| | Structure | 5 units | 10 units | 20 units |
|---|---|---|---|---|
| Example 1 | MMT/APTES | 7.0 | 15.1 | 28.6 |
| Example 2 | ZrP/APTES | 7.3 | 16.0 | 30.7 |
| Comparative Example 1 | MMT/PAH | 6.1 | 11.9 | 22.9 |

Evaluation 2: Evaluation of Adherence

Table 4 shows adherence evaluation results of the samples prepared according to Examples 1 and 2 and Comparative Example 1.

TABLE 4

| | Example 1 | Example 2 | Comparative Example 1 |
|---|---|---|---|
| Number of non-delaminated layers | 100 | 100 | 85 |

The samples according to Examples 1 and 2 have excellent adherence compared to the sample according to Comparative Example 1, and thus those samples have a high close contacting property among the layers.

Evaluation 3: Measurement of Water Vapor Transmission Rate ("WVTR")

Table 5 shows water vapor transmission rates of the barrier film samples prepared according to Examples 3 and 4 and Comparative Example 2 at 40° C. and 90% RH.

TABLE 5

| | Example 3 | | | Example 4 | | | Comparative Example 2 | | |
|---|---|---|---|---|---|---|---|---|---|
| Material A | APTES | | | APTES | | | PAH | | |
| Material B | MMT | | | ZrP | | | MMT | | |
| The number of stacking layers (unit) | 5 | 10 | 20 | 5 | 10 | 20 | 5 | 10 | 20 |
| WVTR (g/m²/day) | 0.317 | 0.0149 | 0.0028 | 0.3452 | 0.0669 | 0.0308 | 2.3773 | 1.1614 | 0.6111 |

The barrier film samples prepared according to Examples 3 and 4 have remarkably deteriorated water vapor transmission rates ("WVTR") compared to the deteriorated water vapor transmission rate according to Comparative Example 2. Accordingly, the barrier film samples prepared according to Examples 3 and 4 have improved barrier performance compared to the sample prepared according to Comparative Example 2.

In addition, the barrier films prepared according to Examples 3 and 4 and having a thin thickness of less than or equal to about 50 nm have high barrier performance ranging from about $10^{-3}$ to 0.5 g/m²/day.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

For example, the present disclosure illustrates the first and second materials interacting with each other through a combination of two kinds of chemical bonds or another combination of one electrostatic force and one chemical bond. However, the present disclosure is not limited thereto, and may include, for example, interaction of a first material having three kinds of functional groups with the second material through a combination of three kinds of chemical bonds or another combination of two kinds of chemical bonds and one electrostatic force.

What is claimed is:

1. A multi-layer thin film assembly, comprising:
    a first layer consisting essentially of a first material, wherein the first material is formed from a mixture of an alkoxysilane compound represented by General Formula 1 comprising at least two kinds of functional groups and a metal alkoxide compound represented by General Formula 2; and
    a second layer disposed on the first layer, and consisting essentially of a second material, wherein the second material interacts with the at least two kinds of functional groups:

$$X_n Si(OR)_{4-n}$$ General Formula 1 wherein, in General Formula 1,
    R is an alkyl group,
    X is at least one selected from a nitrogen-containing group, an oxo-acid group, and an anhydride of the oxo-acid group, and n is an integer of 1 to 4;

$$M'(OR')_m$$ General Formula 2 wherein, in General Formula 2,
    M' is a metal,
    R' is an alkyl group, which is the same as or different from R in General Formula 2, and
    m is an integer of 2 to 6;
    wherein a plurality of the first layer and the second layer are alternatively stacked;
    wherein at least a portion of the first material is covalently bonded to a substrate comprising an inorganic material selected from the group consisting of a ceramic, glass, metal, or a silicon wafer having an oxidized surface;
    wherein the second material comprises an inorganic layered compound; and
    wherein the second material interacts with the at least two kinds of functional groups of the first material through an electrostatic force and a covalent bond.

2. The multi-layer thin film assembly of claim 1, wherein at least one of the at least two kinds of functional groups of the first material is a functional group that is electrostatically chargeable with a positive charge or a negative charge.

3. The multi-layer thin film assembly of claim 2, wherein the second material comprises a material that is electrostatically chargeable with a charge opposite to that of the at least one electrostatically chargeable functional group of the first material.

4. The multi-layer thin film assembly of claim 1, wherein the first material comprises a plurality of at least one kind of the functional groups which interact with each other.

5. The multi-layer thin film assembly of claim 1, wherein the functional group comprises at least one selected from a nitrogen-containing group, an oxo-acid group, an ester of an oxo-acid group, an anhydride of an oxo-acid group, a hydroxyl group, an epoxide group, an ester group, an isocyanate group, an acid halide group, a urea group, a thiol group, an aldehyde group, an imide group, an amide group, an unsaturated group, an acetal group, an imine group, and a thiocyanate group.

6. The multi-layer thin film assembly of claim 1, wherein the inorganic layered compound comprises at least one selected from a clay mineral, a phosphate salt-based derivative compound, and layered plural hydrates.

7. The multi-layer thin film assembly of claim 1, wherein the at least two kinds of functional groups are present on one of a flat plane and an edge part of the inorganic layered compound.

8. A barrier film for an electronic device comprising the multi-layer thin film assembly according to claim 1.

9. The barrier film for an electronic device of claim 8, wherein the multi-layer thin film assembly has a film thickness of less than or equal to about 50 nanometers.

10. The barrier film for an electronic device of claim 8, wherein the barrier film for an electronic device has a water vapor transmission rate of less than or equal to about 0.5 gram per square meter per day.

11. The barrier film for an electronic device of claim 8, wherein a plurality of the first layer and the second layer are alternately stacked.

12. The barrier film for an electronic device of claim 8, wherein the second material interacts with the at least two kinds of the functional groups of the first material through at least one of an electrostatic force and a chemical bonding force.

13. The barrier film for an electronic device of claim 8, wherein at least one of the at least two kinds of functional groups of the first material is a functional group comprising a positive charge or a negative charge.

14. The barrier film for an electronic device of claim 13, wherein the second material comprises a charge opposite to the positive or negative charge of the functional groups of the first material.

* * * * *